(12) United States Patent
Oosako et al.

(10) Patent No.: US 11,902,686 B2
(45) Date of Patent: Feb. 13, 2024

(54) PHOTODETECTION DEVICE AND ELECTRONIC APPARATUS

(71) Applicant: Sony Semiconductor Solutions Corporation, Kanagawa (JP)

(72) Inventors: Youhei Oosako, Kanagawa (JP); Yosuke Ueno, Kanagawa (JP); Masahiro Segami, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 239 days.

(21) Appl. No.: 17/440,325

(22) PCT Filed: Mar. 18, 2020

(86) PCT No.: PCT/JP2020/011910
§ 371 (c)(1),
(2) Date: Sep. 17, 2021

(87) PCT Pub. No.: WO2020/203283
PCT Pub. Date: Oct. 8, 2020

(65) Prior Publication Data
US 2022/0150437 A1 May 12, 2022

(30) Foreign Application Priority Data
Mar. 29, 2019 (JP) .................. 2019-065376

(51) Int. Cl.
*H04N 25/772* (2023.01)
*H03M 1/56* (2006.01)
*H04N 25/75* (2023.01)
*H04N 25/709* (2023.01)

(52) U.S. Cl.
CPC ............ *H04N 25/772* (2023.01); *H03M 1/56* (2013.01); *H04N 25/709* (2023.01); *H04N 25/75* (2023.01)

(58) Field of Classification Search
None
See application file for complete search history.

(56) References Cited

U.S. PATENT DOCUMENTS

2007/0008206 A1    1/2007   Tooyama

FOREIGN PATENT DOCUMENTS

| JP | 2007-019682 A | 1/2007 |
| JP | 2018-148541 A | 9/2018 |
| JP | 2018-186478 A | 11/2018 |

OTHER PUBLICATIONS

International Search Report (PCT/ISA/210), International Application No. PCT/JP2020/011910, dated Mar. 18, 2020.

*Primary Examiner* — Mark T Monk
(74) *Attorney, Agent, or Firm* — Michael Best & Friedrich LLP

(57) ABSTRACT

A photodetection device according to the present disclosure includes: a first pixel that is configured to generate a first pixel signal; a reference signal generator that is configured to generate a reference signal; and a first converter that includes a first buffer circuit and a first comparison circuit and is configured to convert the first pixel signal into a digital code, the first buffer circuit configured to output a first signal corresponding to the reference signal from an output terminal, and the first comparison circuit configured to perform a comparison operation on the basis of the first pixel signal and the first signal.

21 Claims, 27 Drawing Sheets

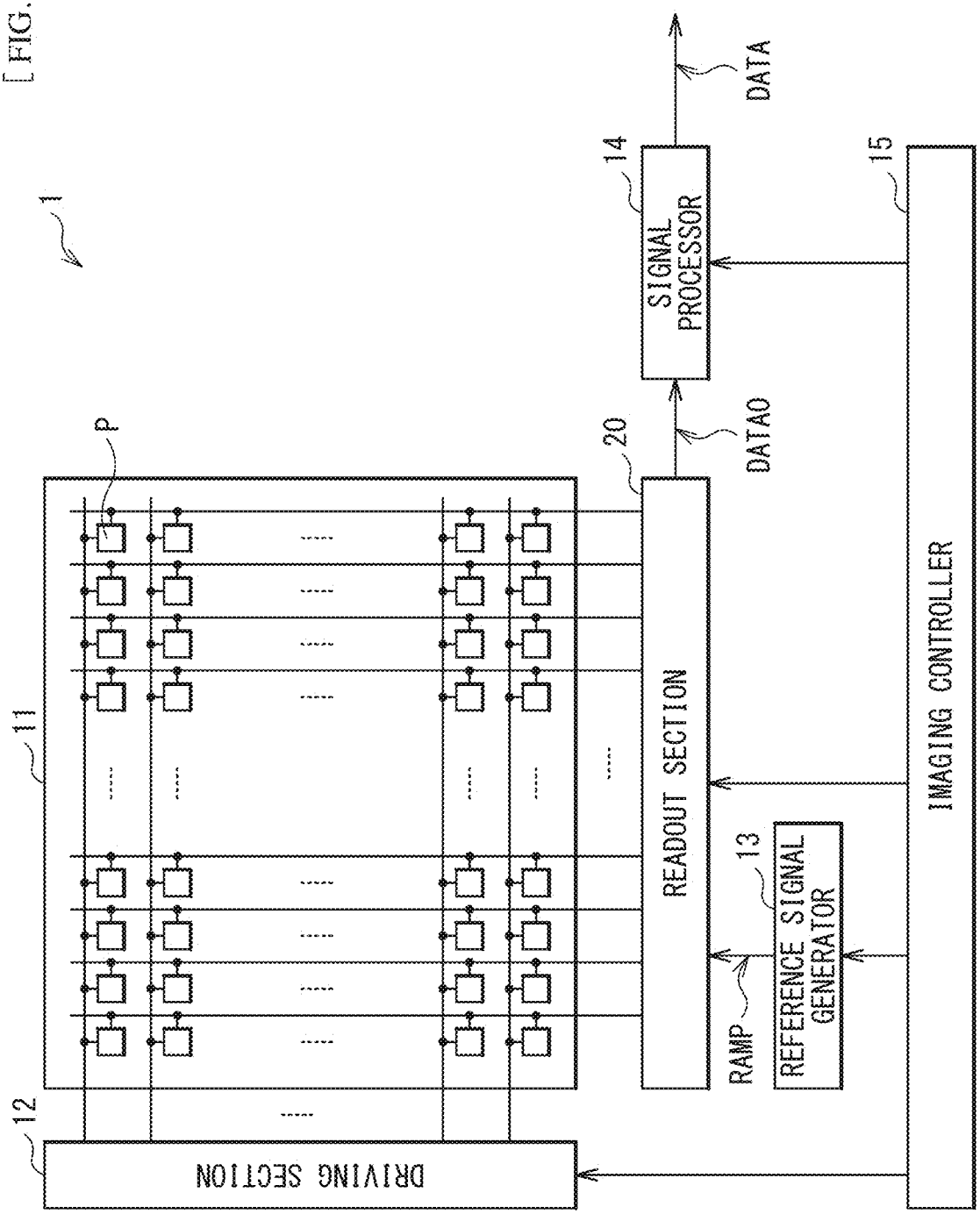
[FIG. 1]

[ FIG. 2 ]
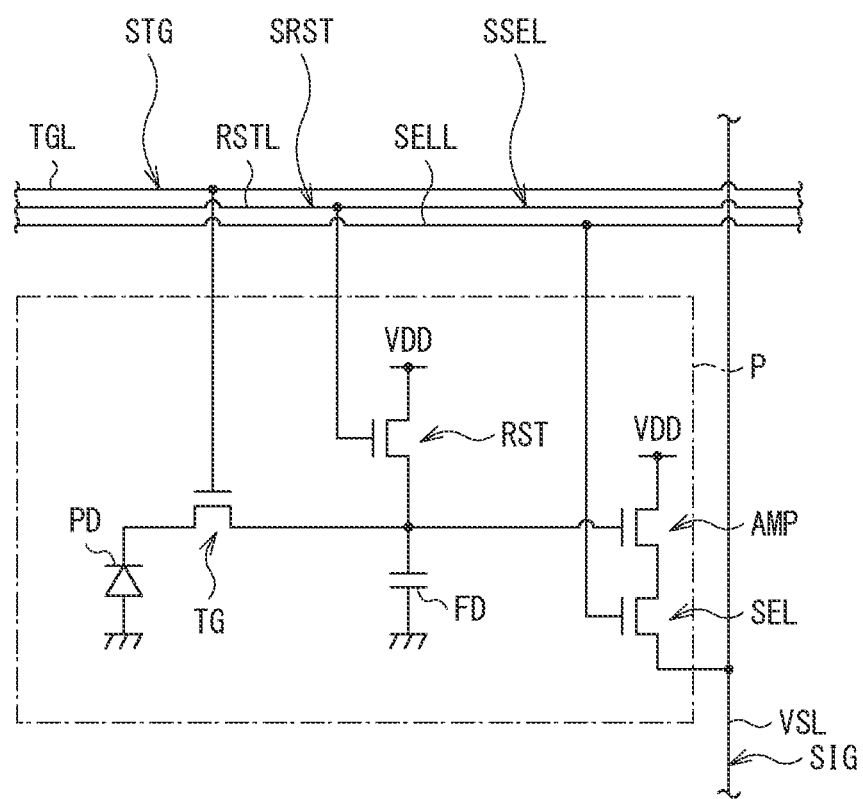

[FIG. 3]
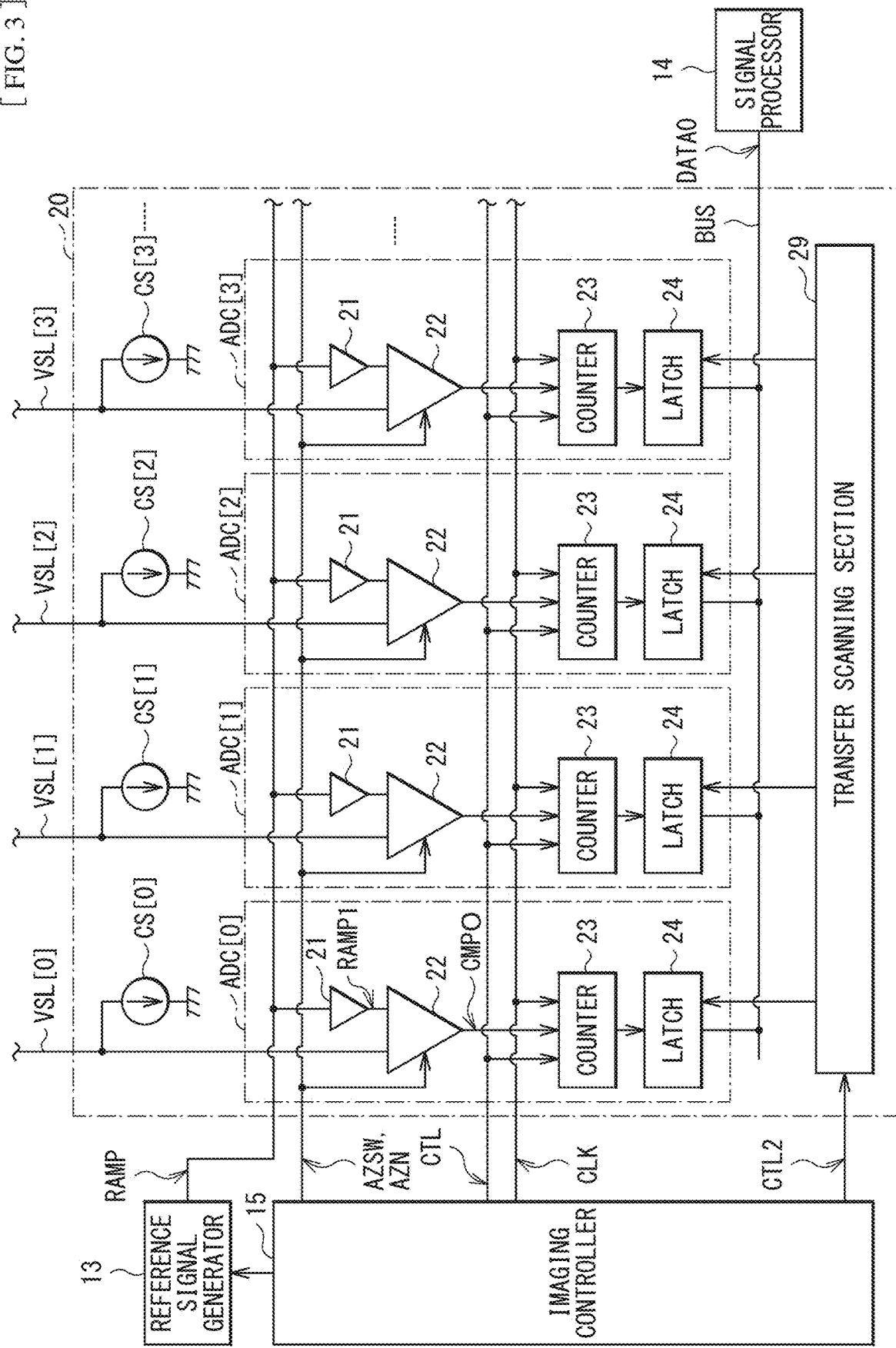

[ FIG. 4A ]
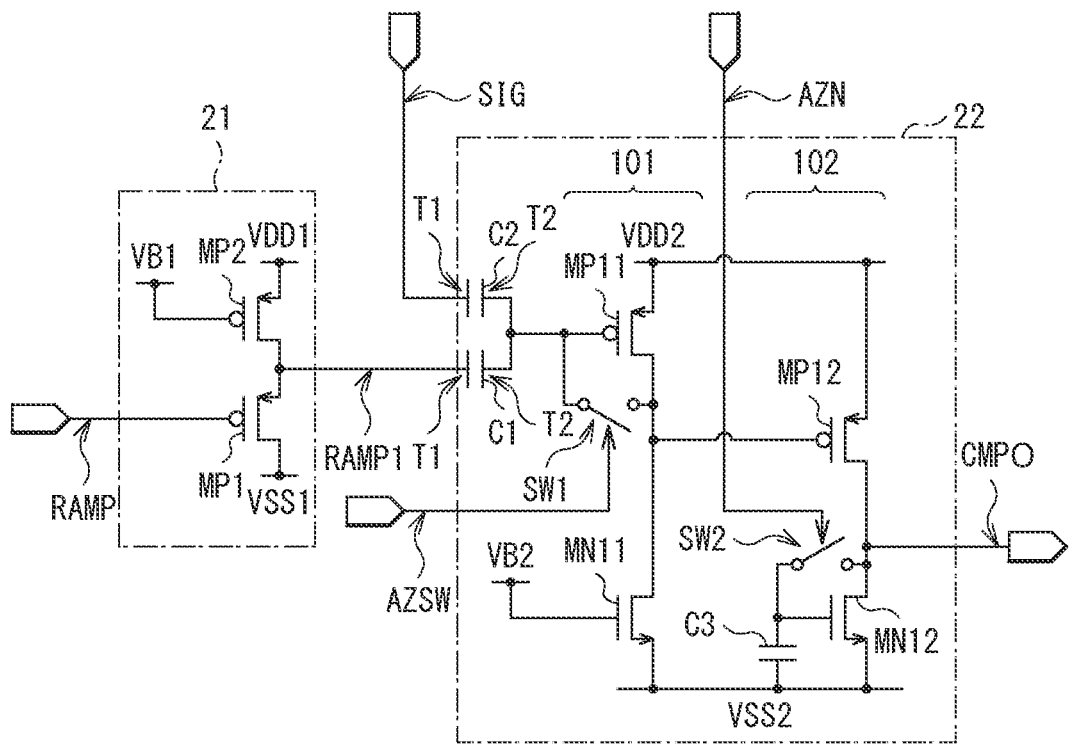
[ FIG. 4B ]
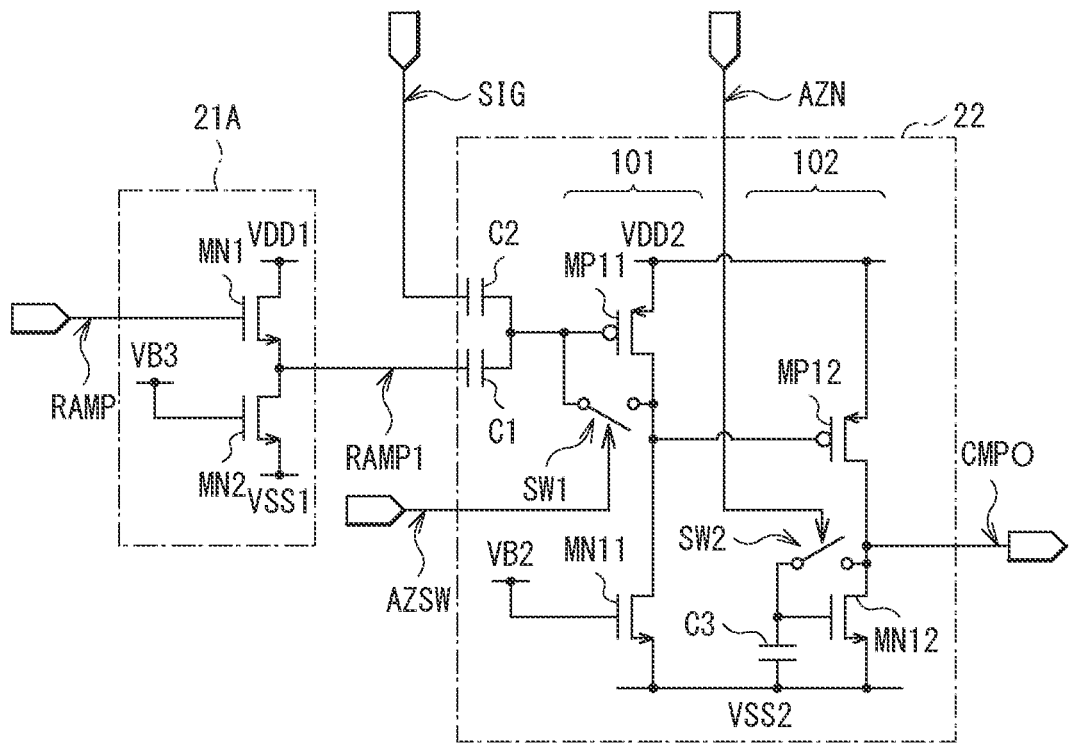

[FIG. 4C]
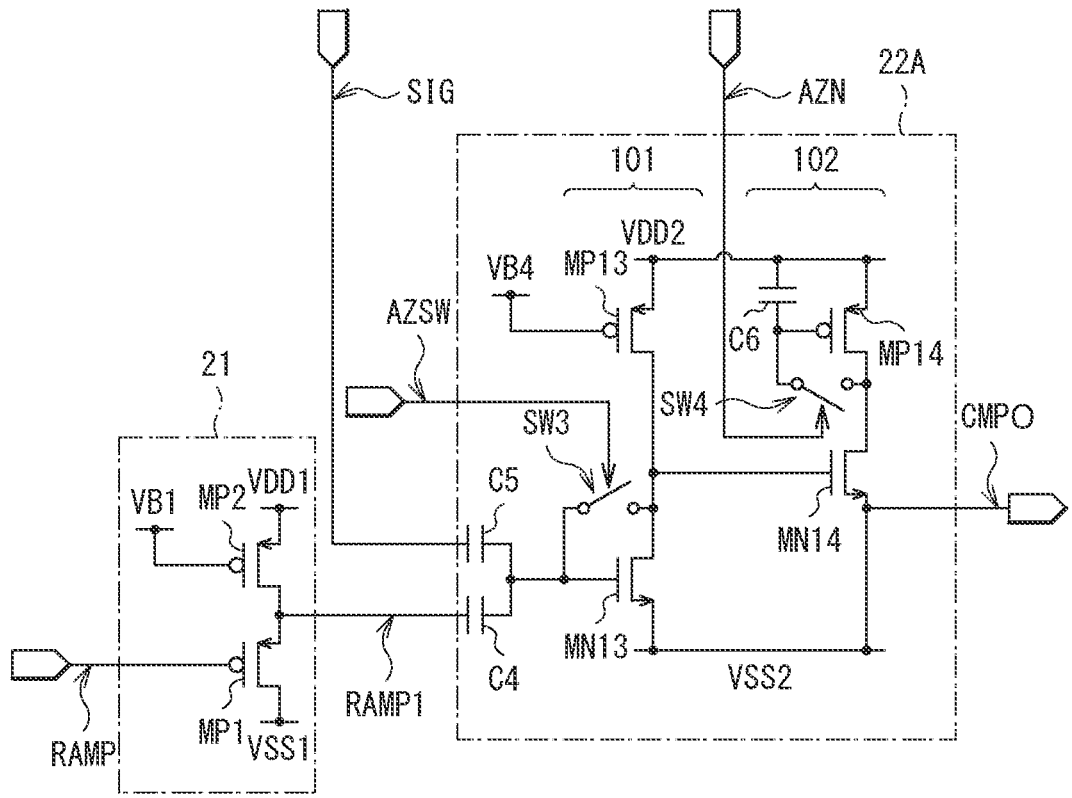
[FIG. 4D]
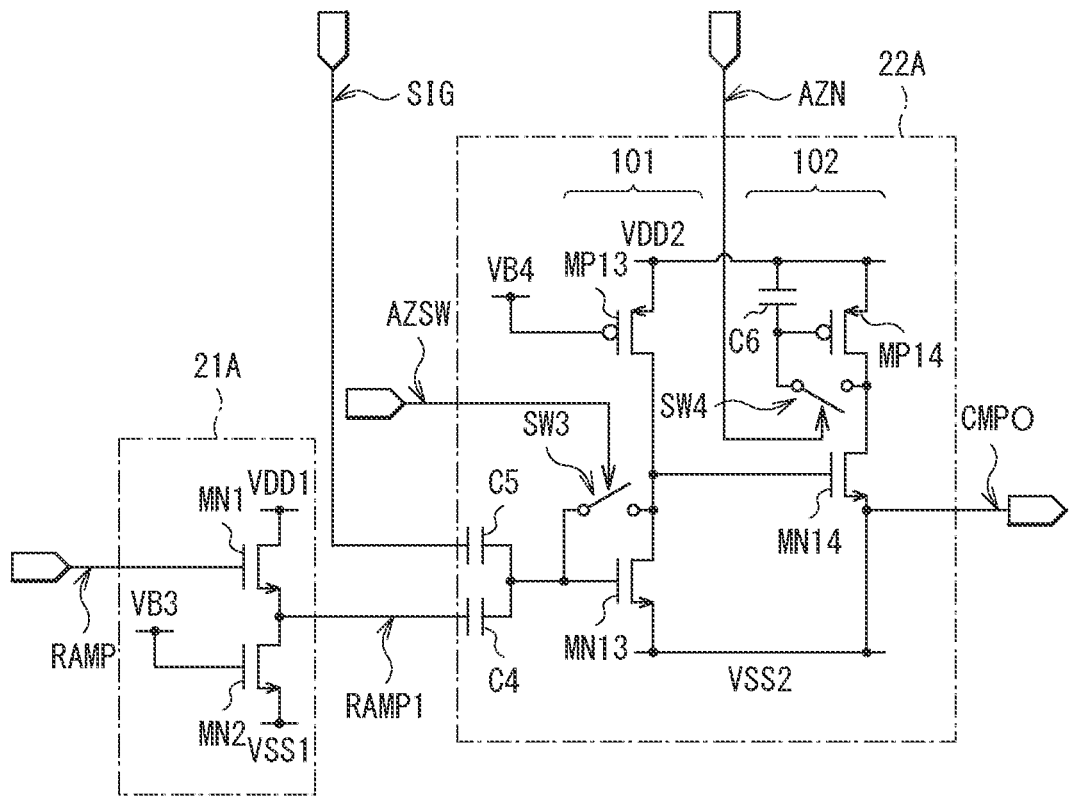

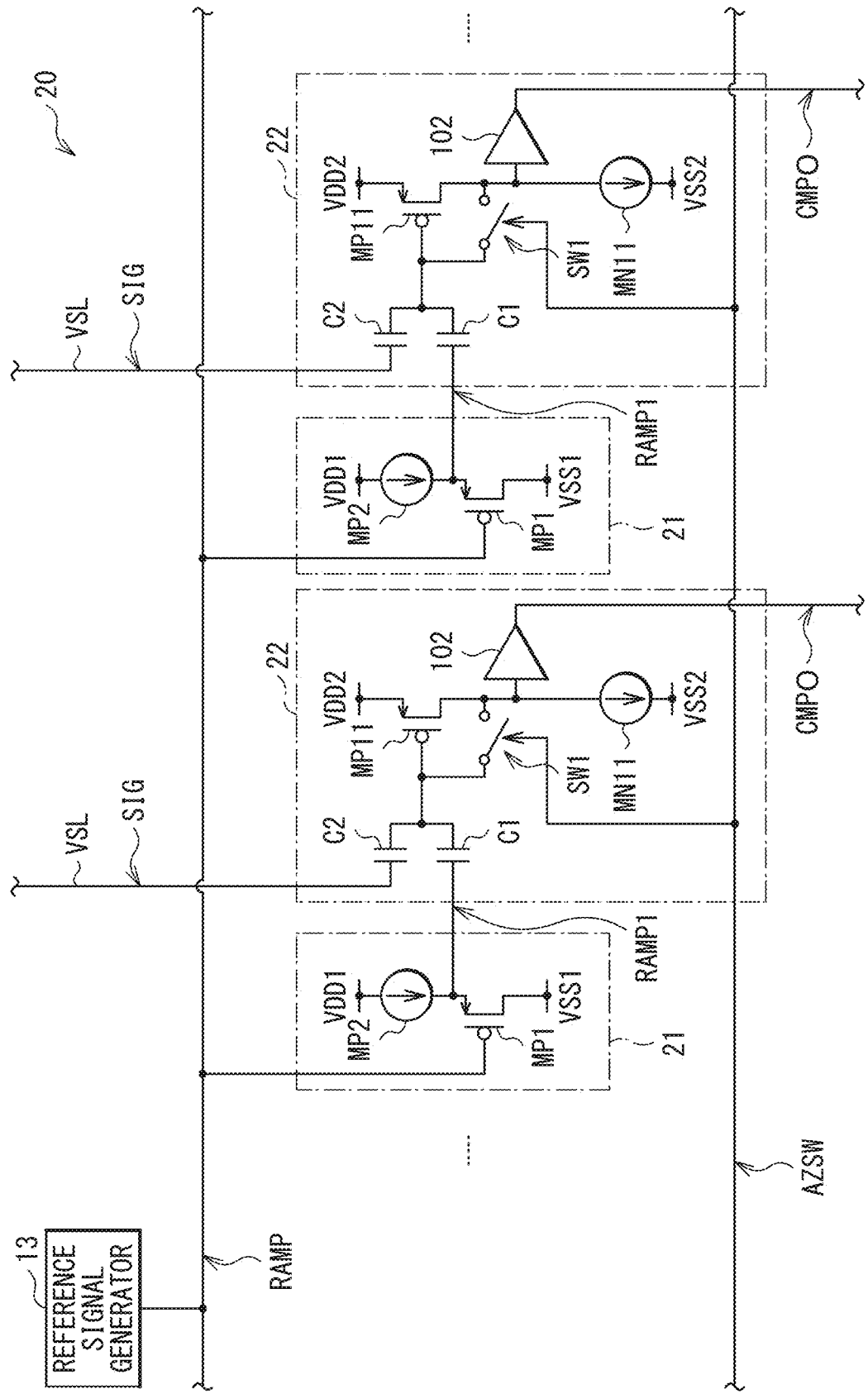

[FIG.6]
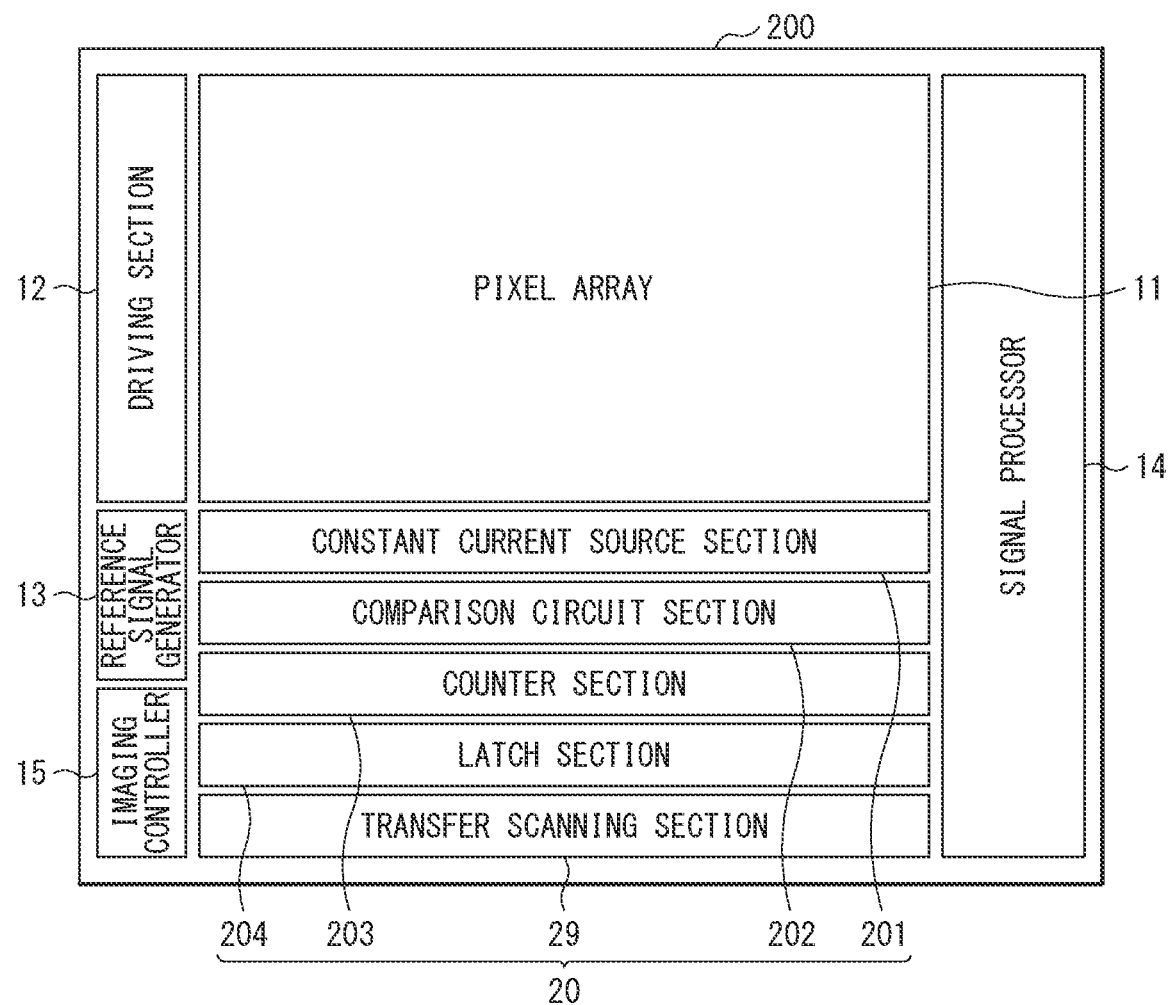

[FIG. 7]
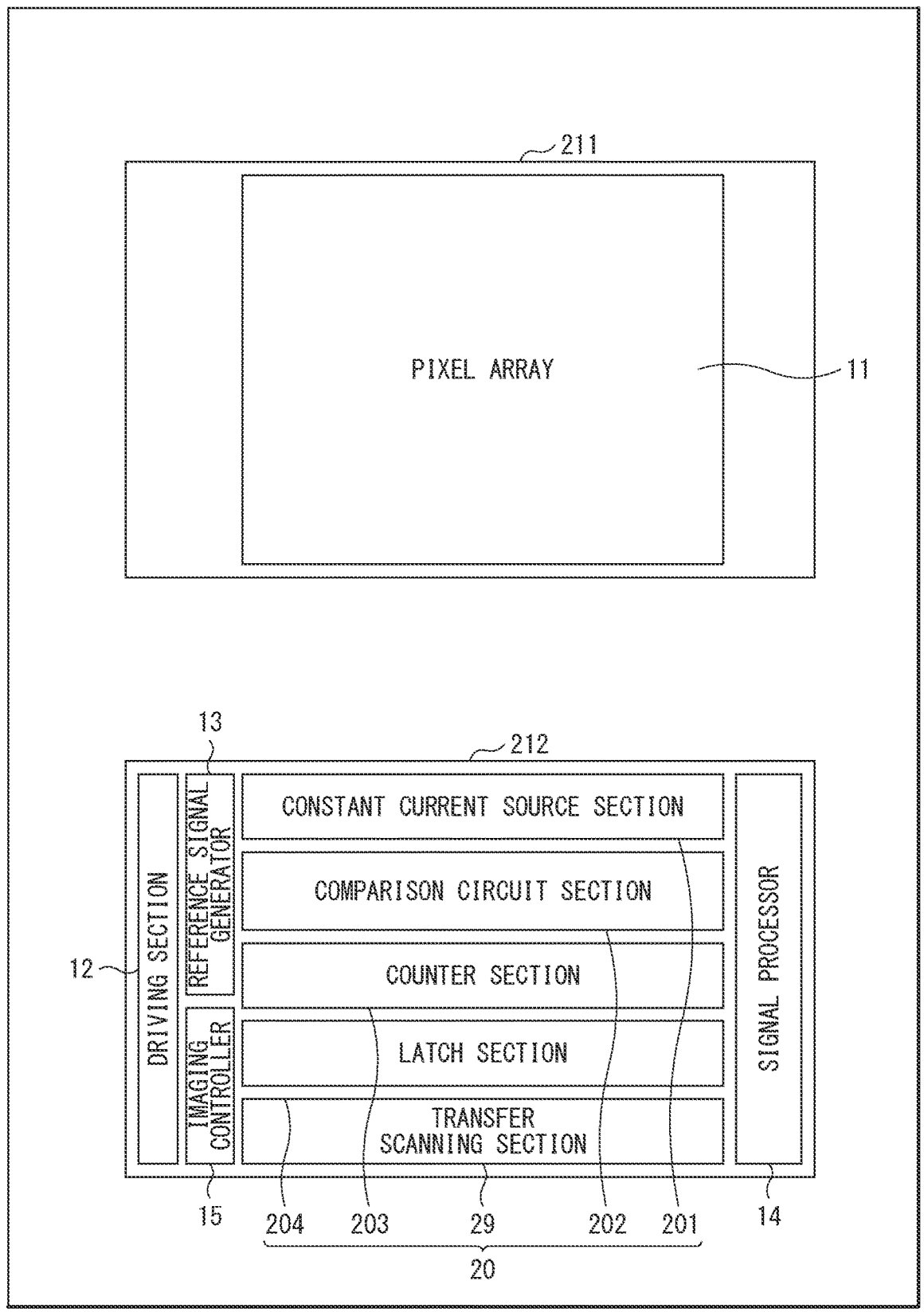

[FIG. 8]
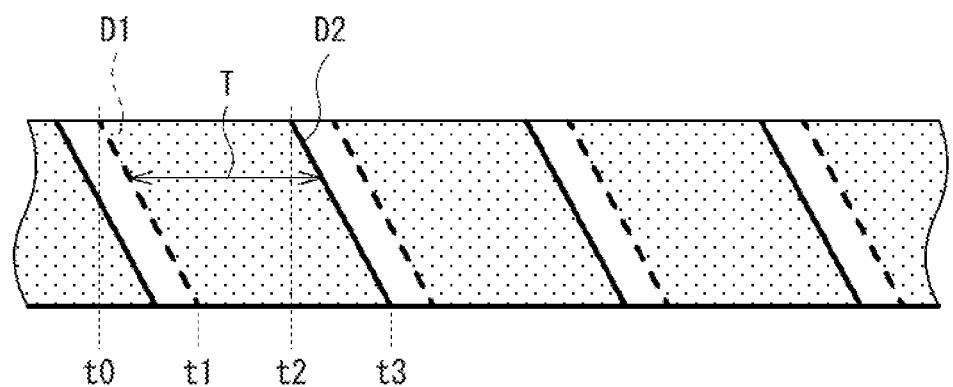

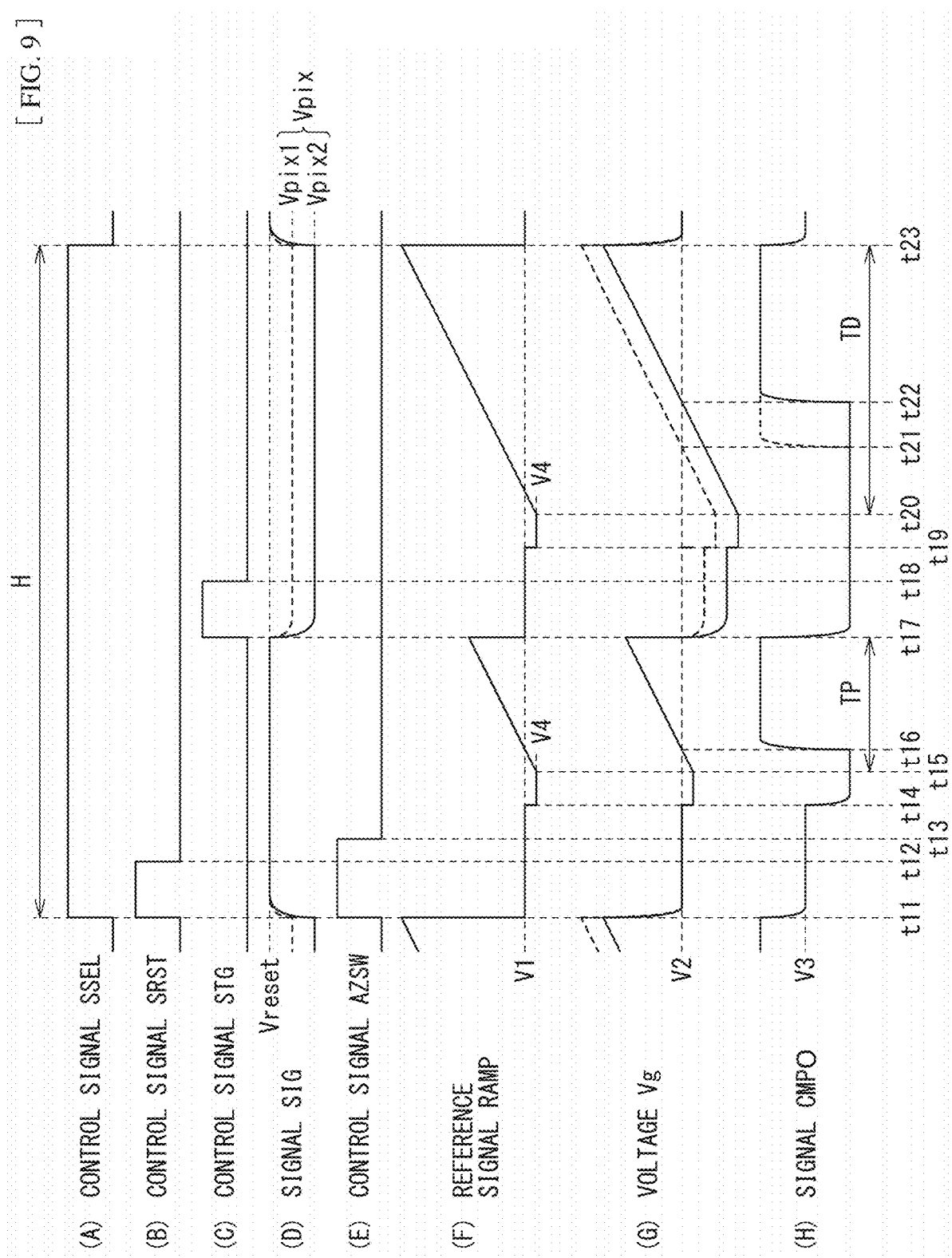

[ FIG. 10A ]
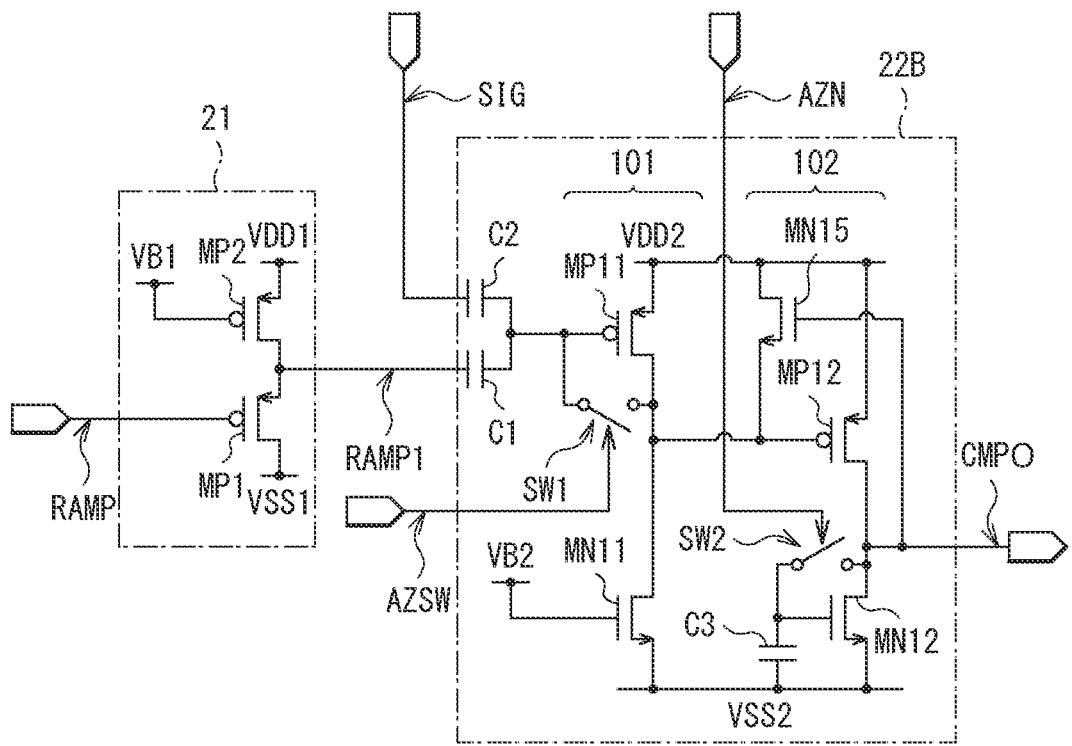
[ FIG. 10B ]
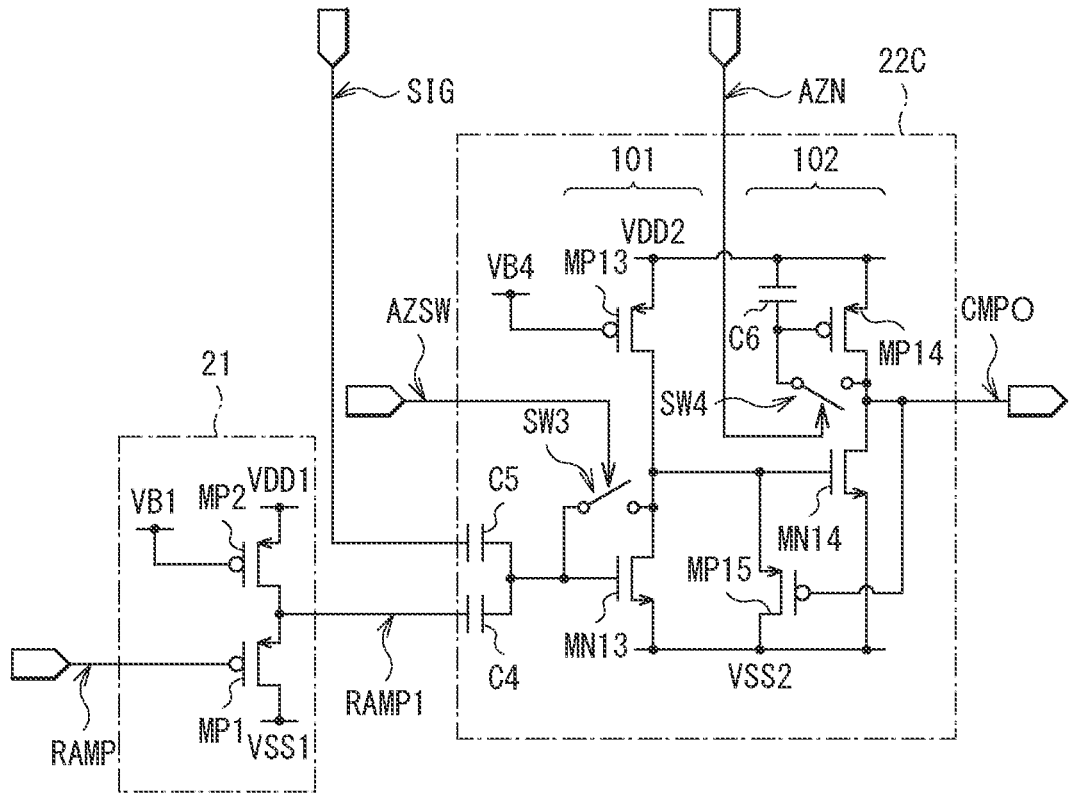

[FIG. 11A]
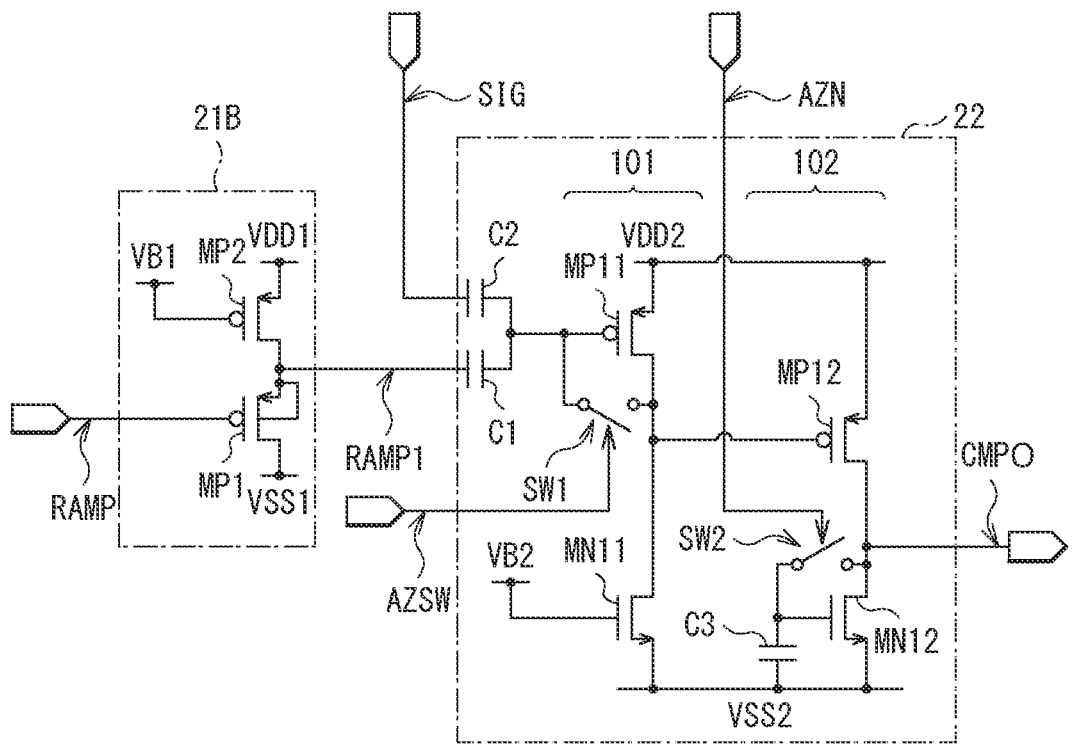
[FIG. 11B]
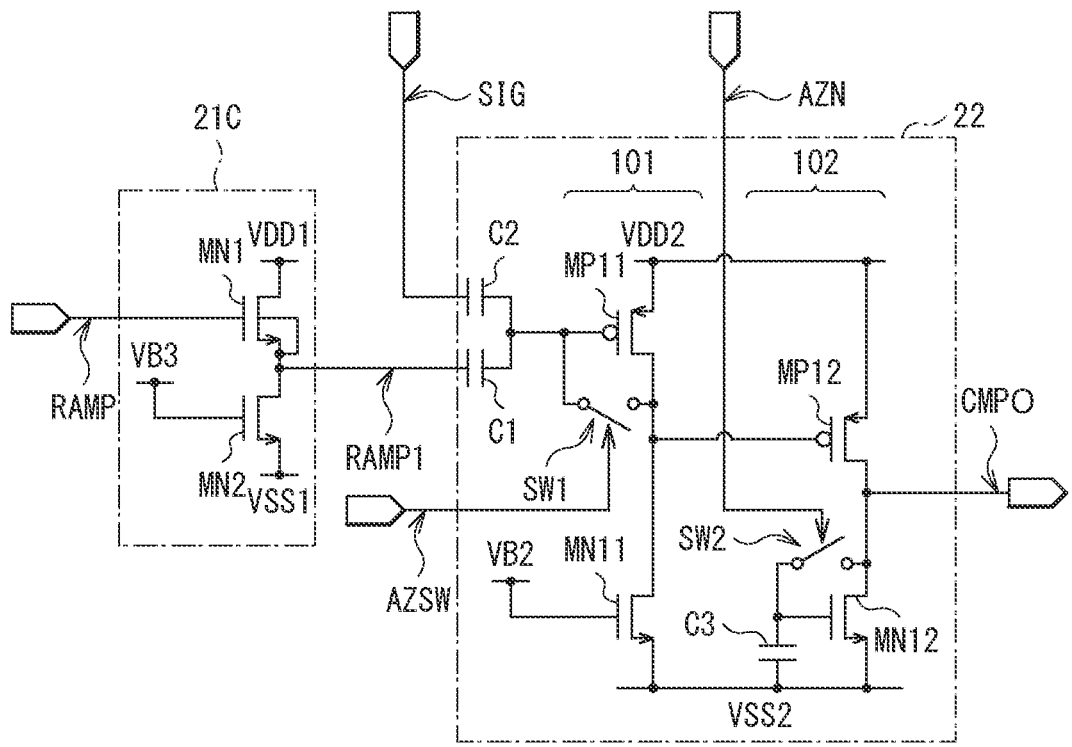

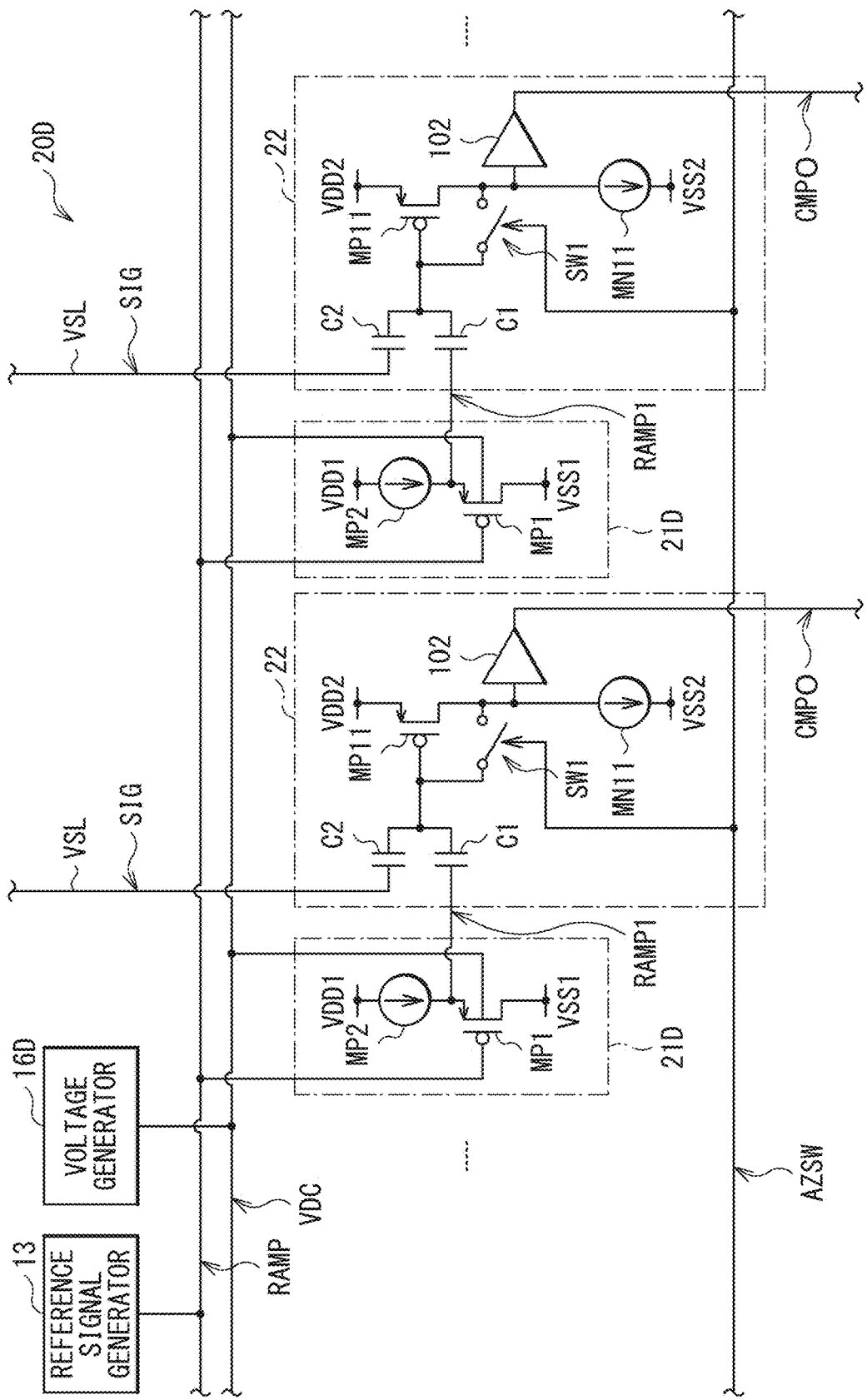

[ FIG. 13 ]
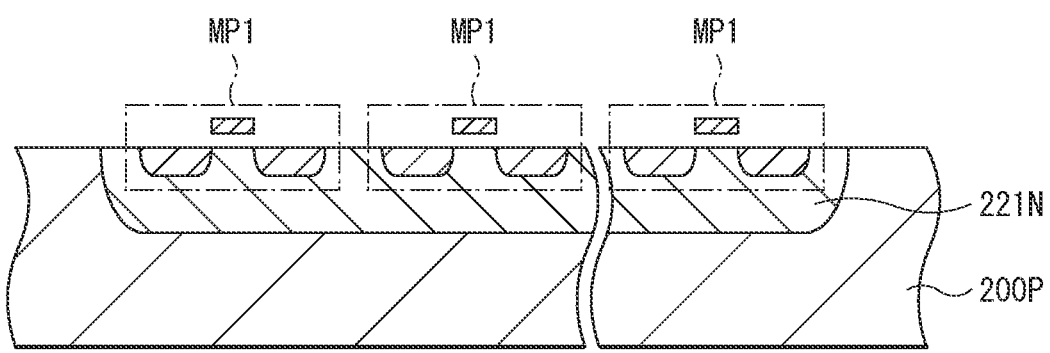

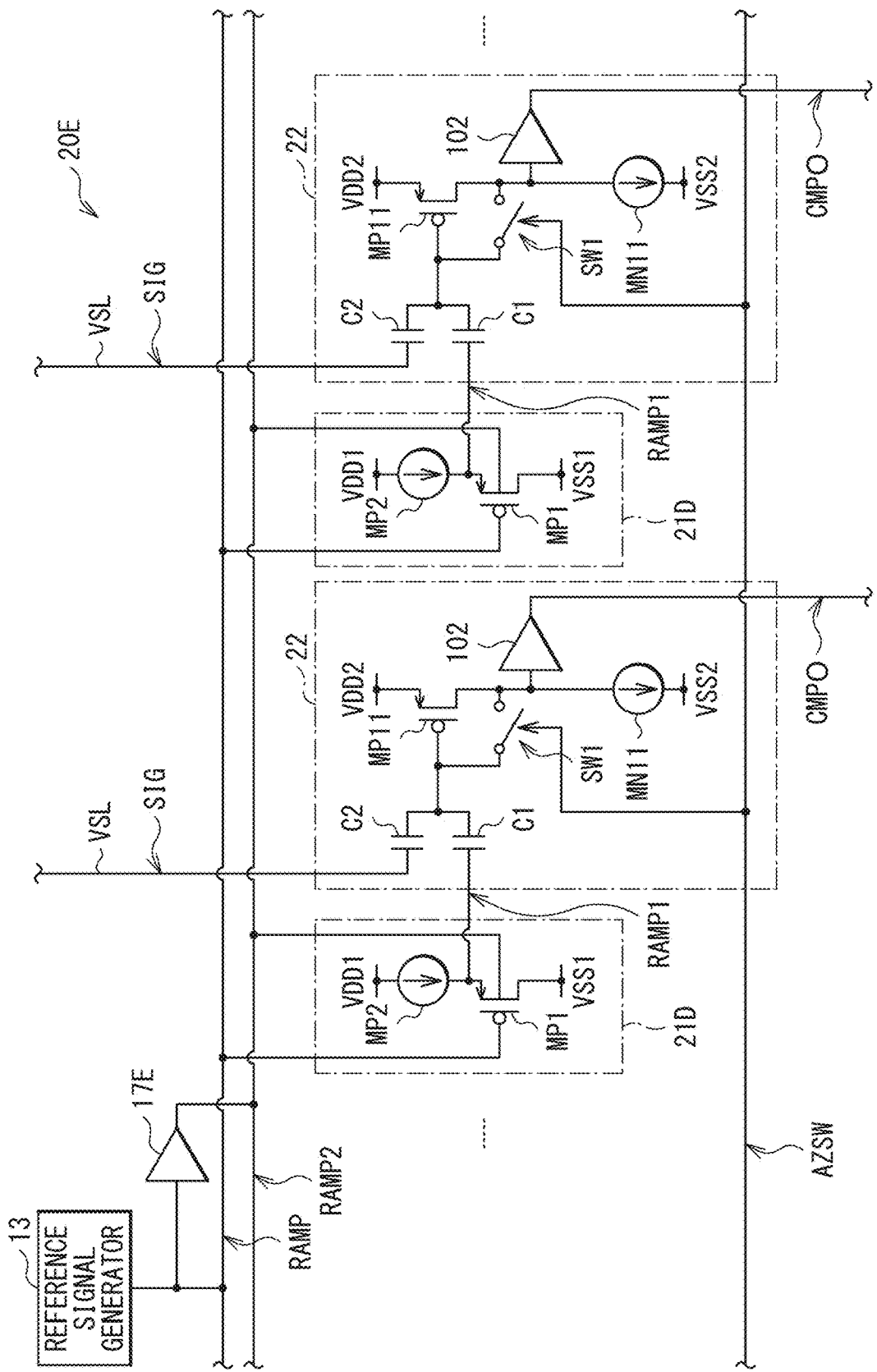
[FIG. 14]

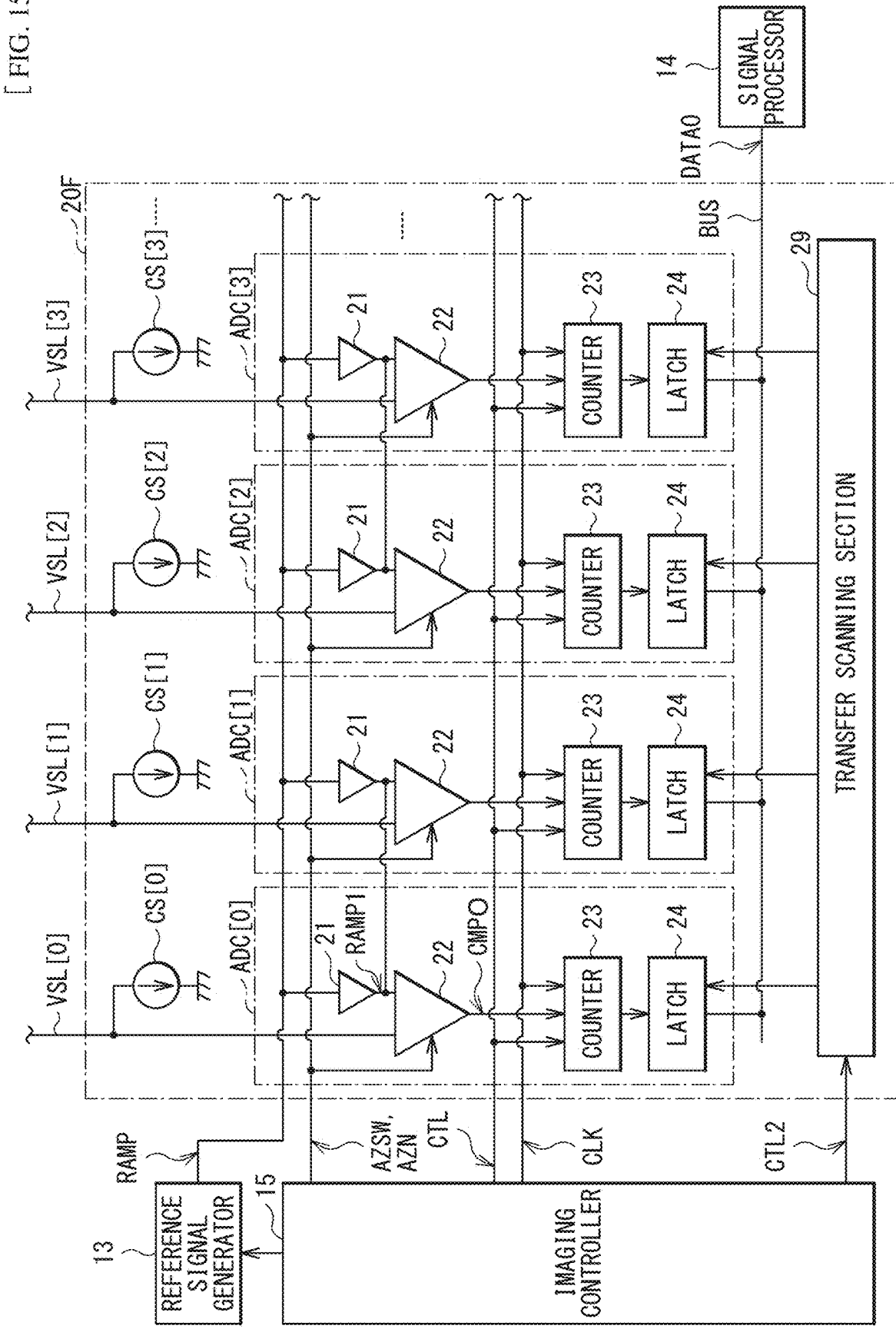
[FIG. 15]

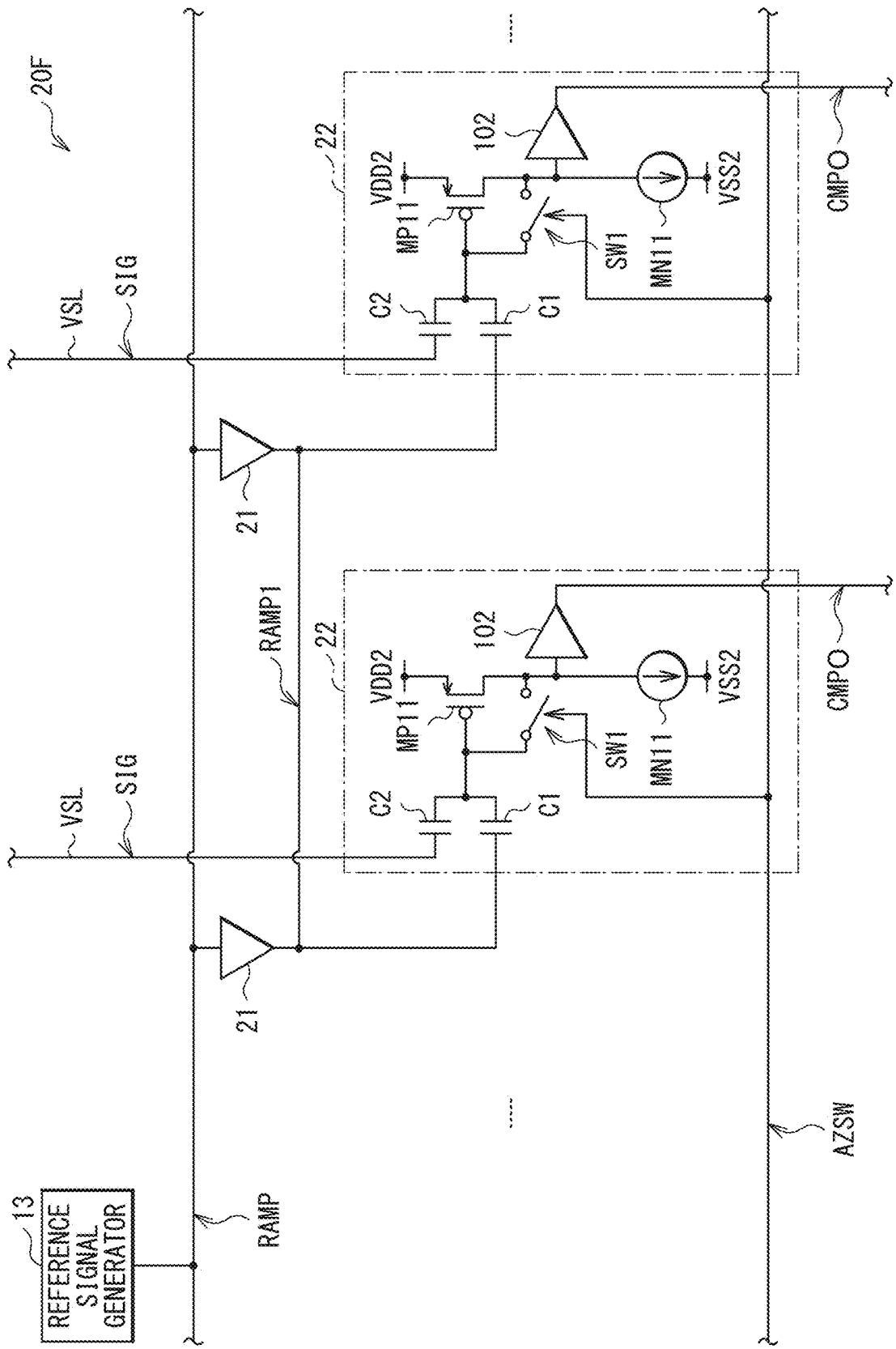

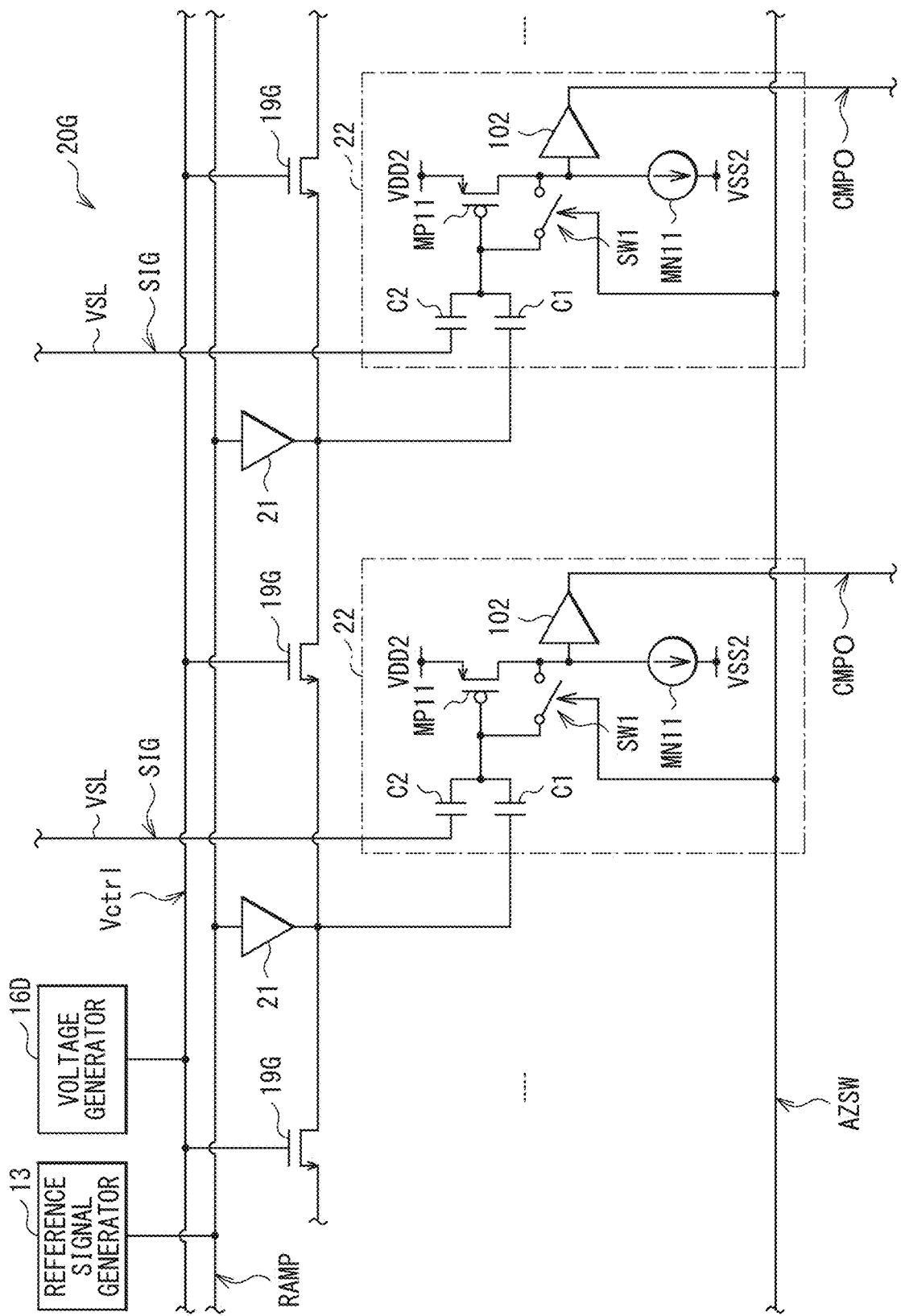
[FIG. 17]

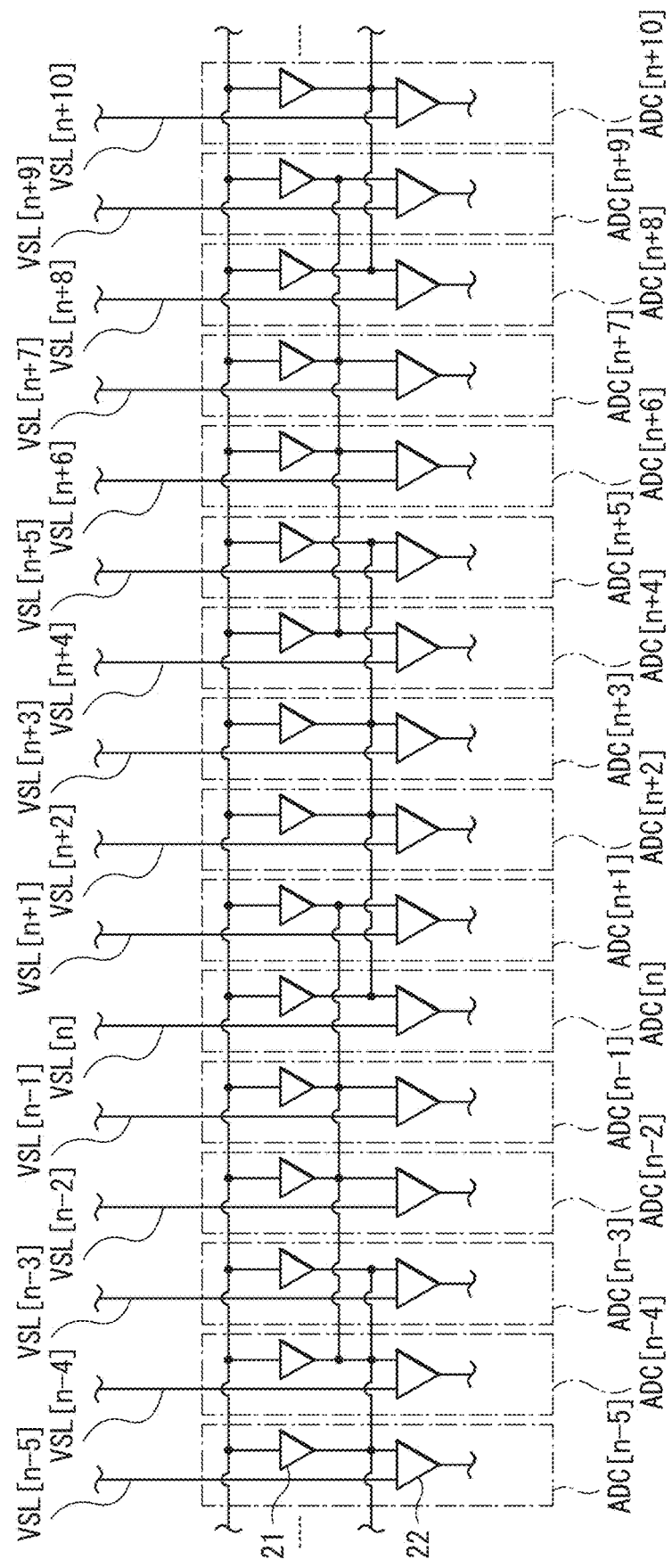
[FIG. 18]

[ FIG. 19A ]
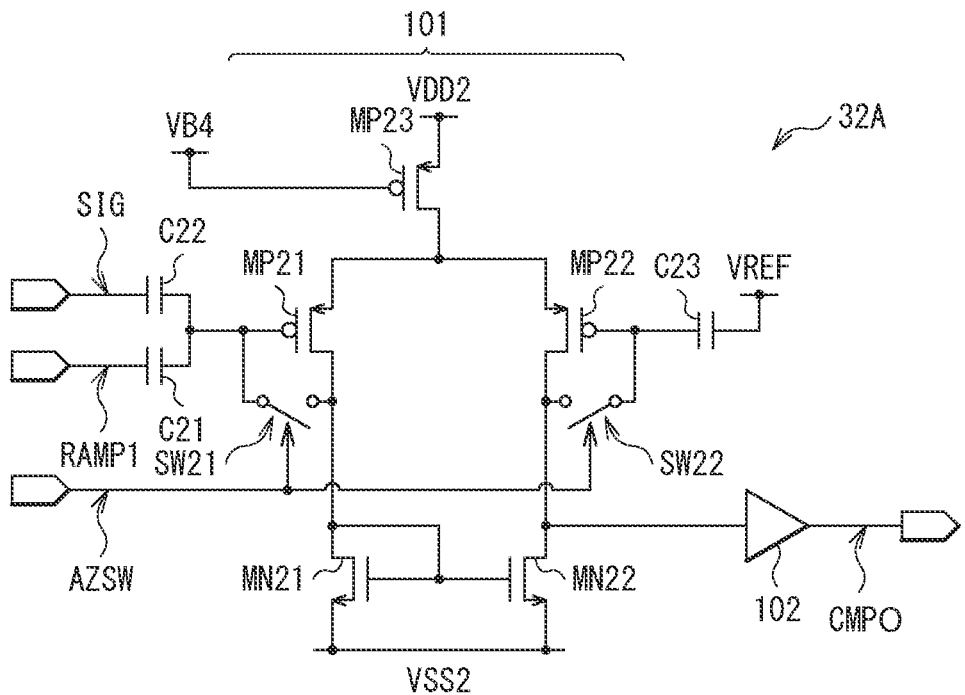
[ FIG. 19B ]
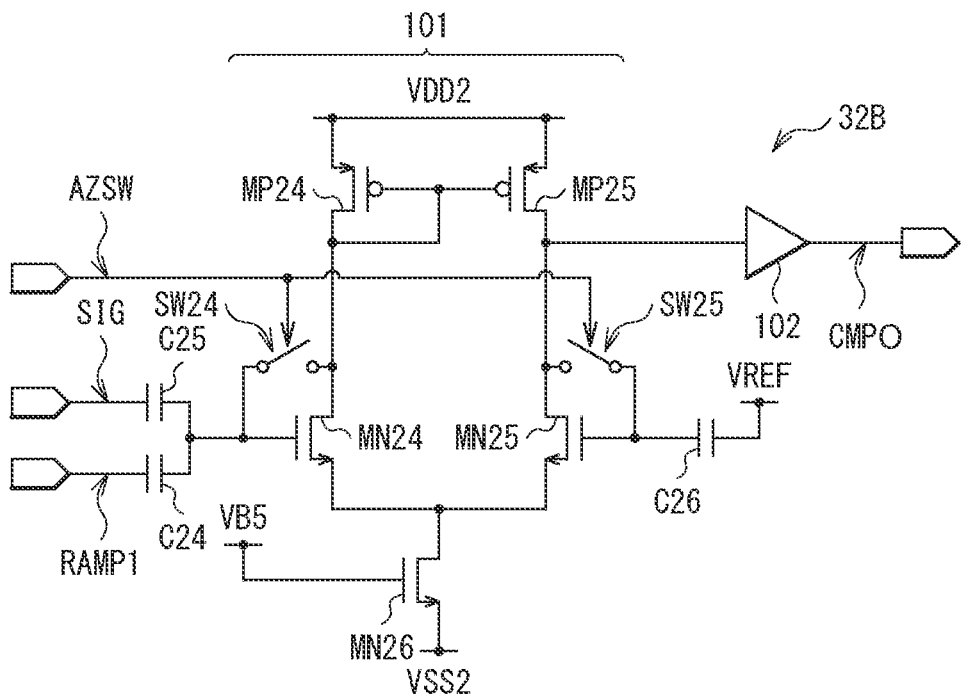

[ FIG. 20A ]
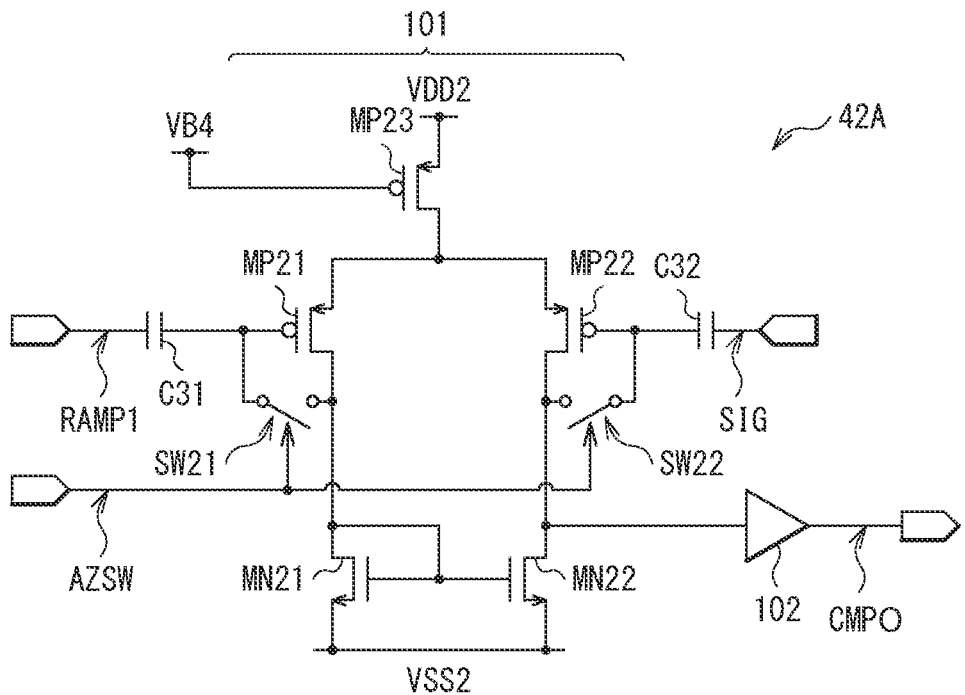
[ FIG. 20B ]
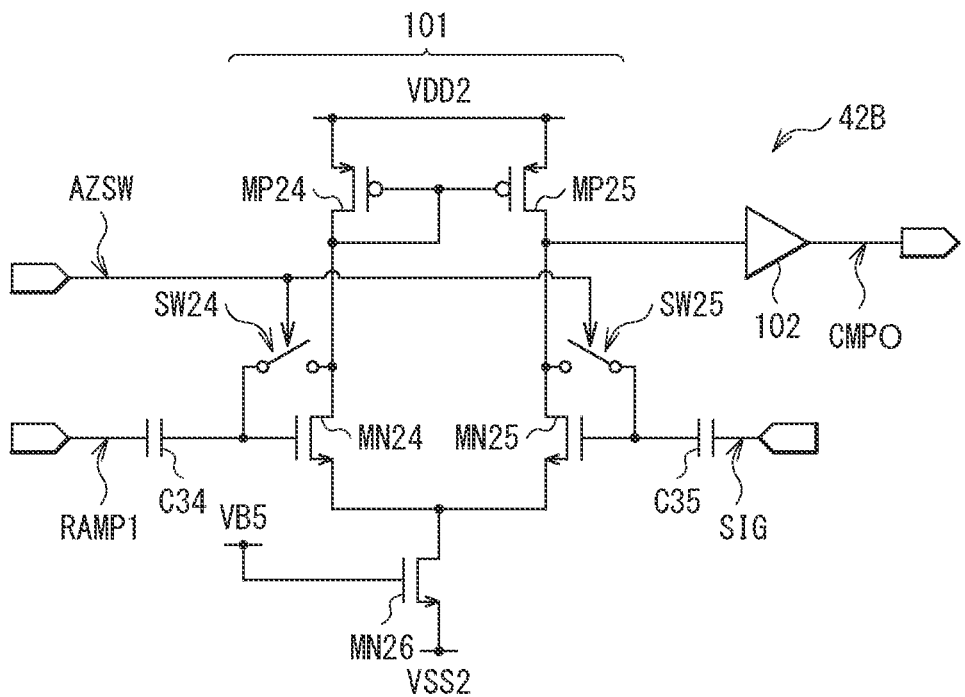

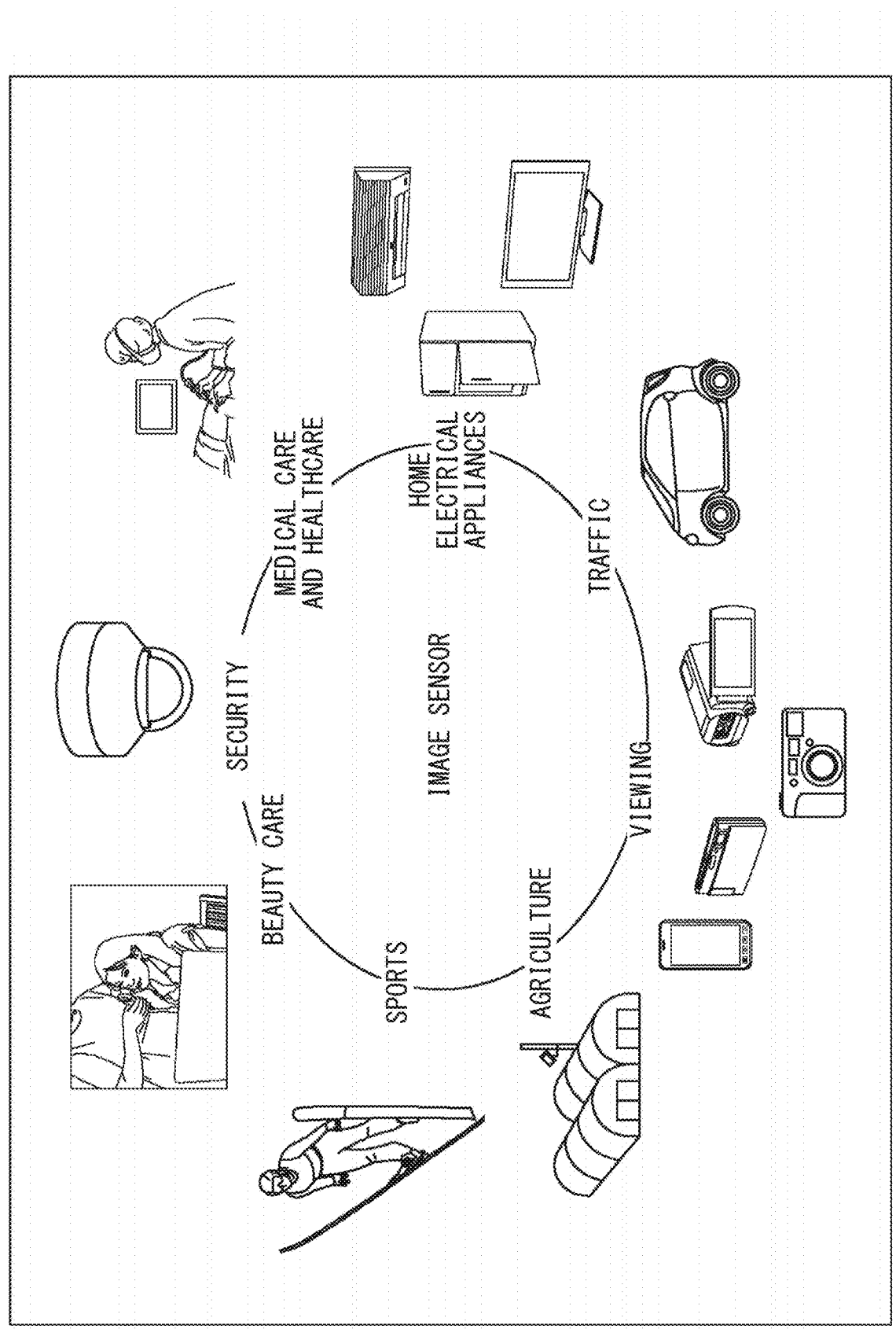
[FIG. 21]

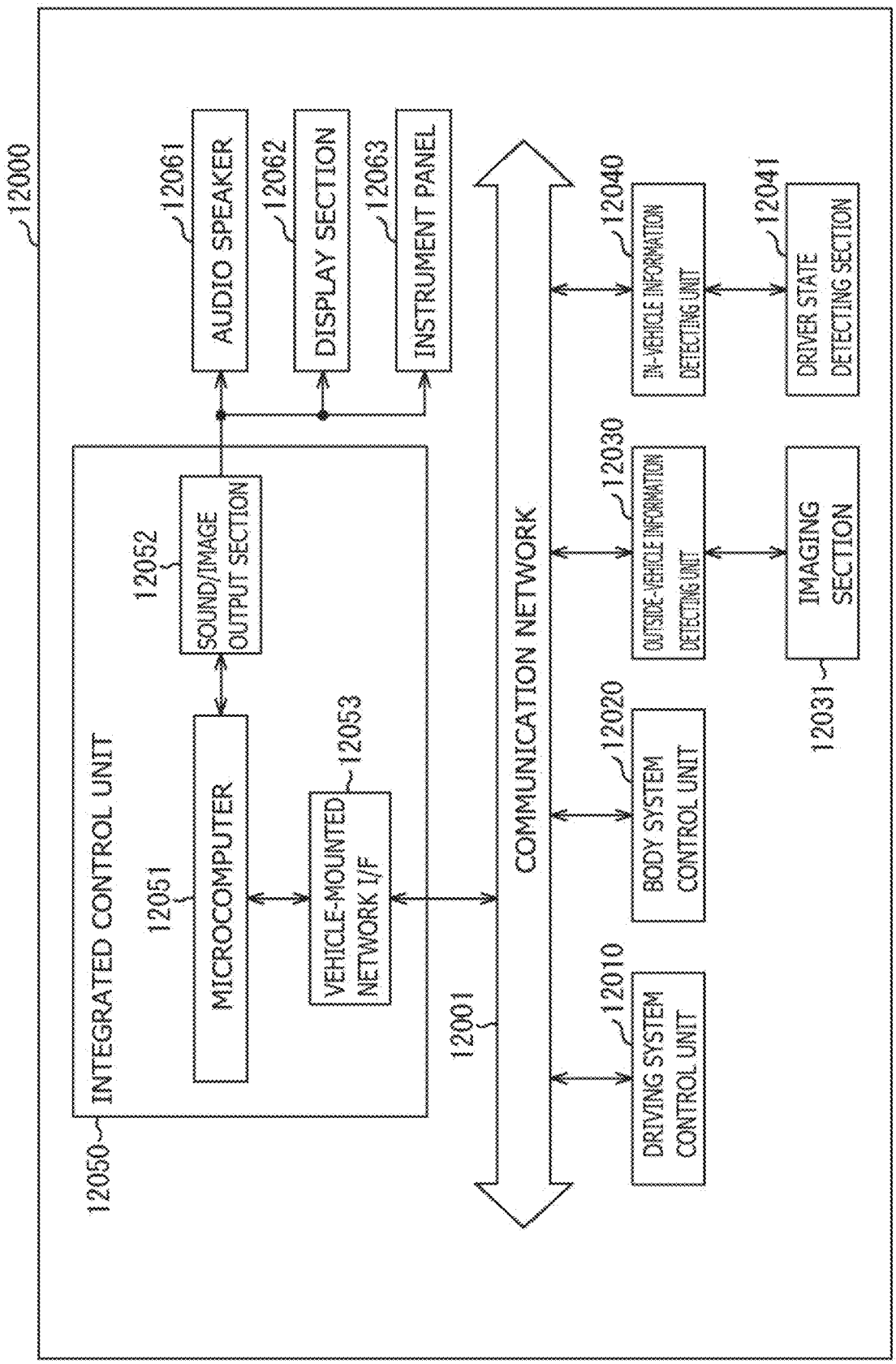

[FIG. 23]
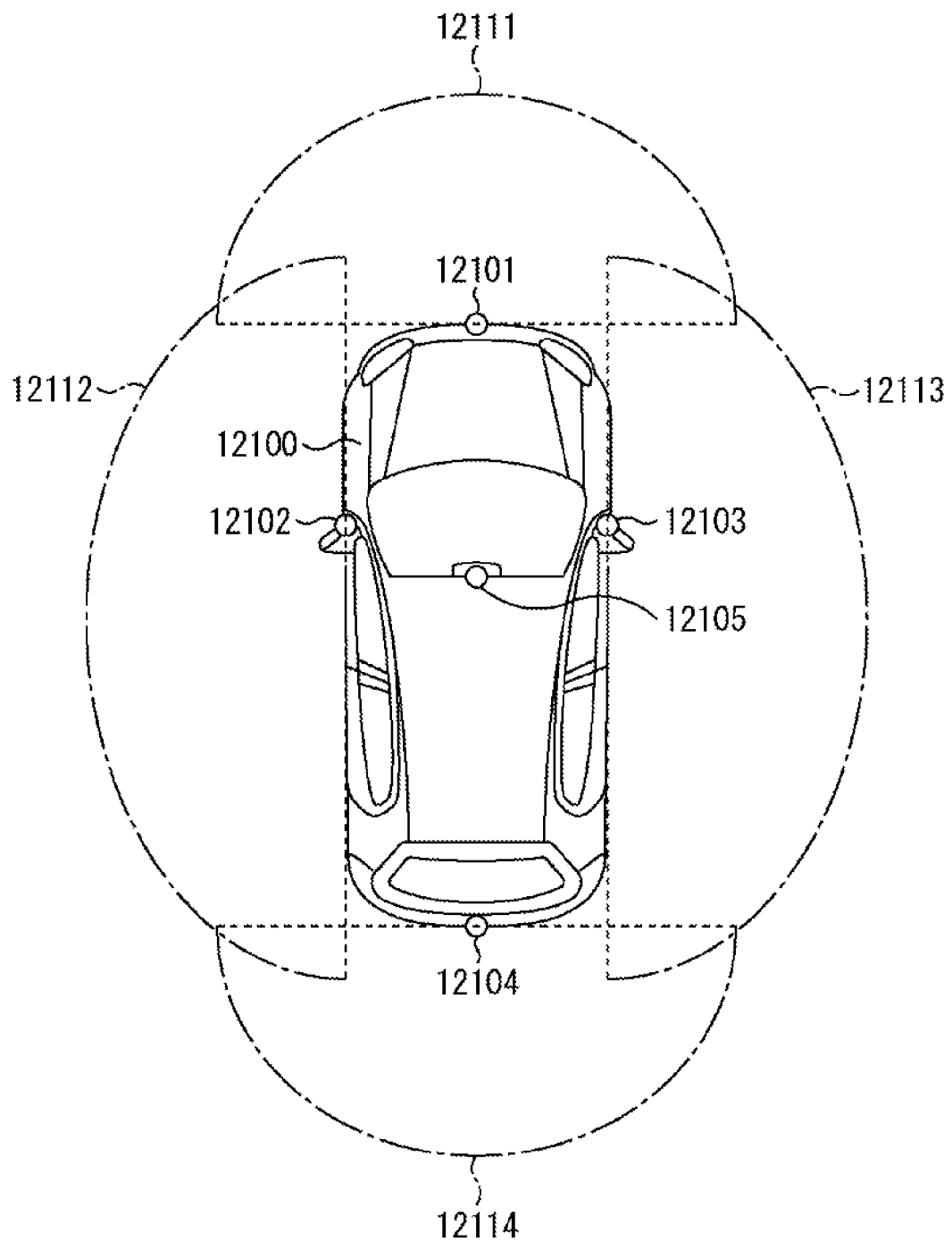

[ FIG. 24 ]
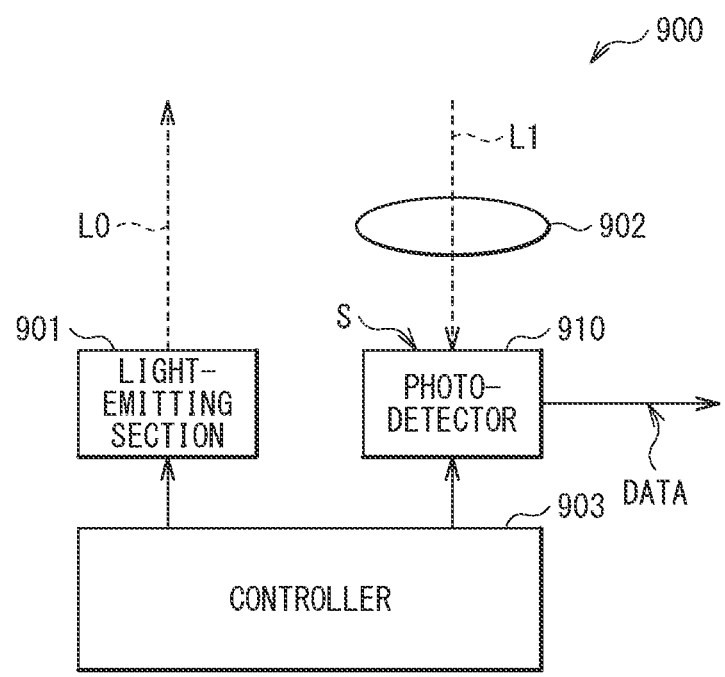

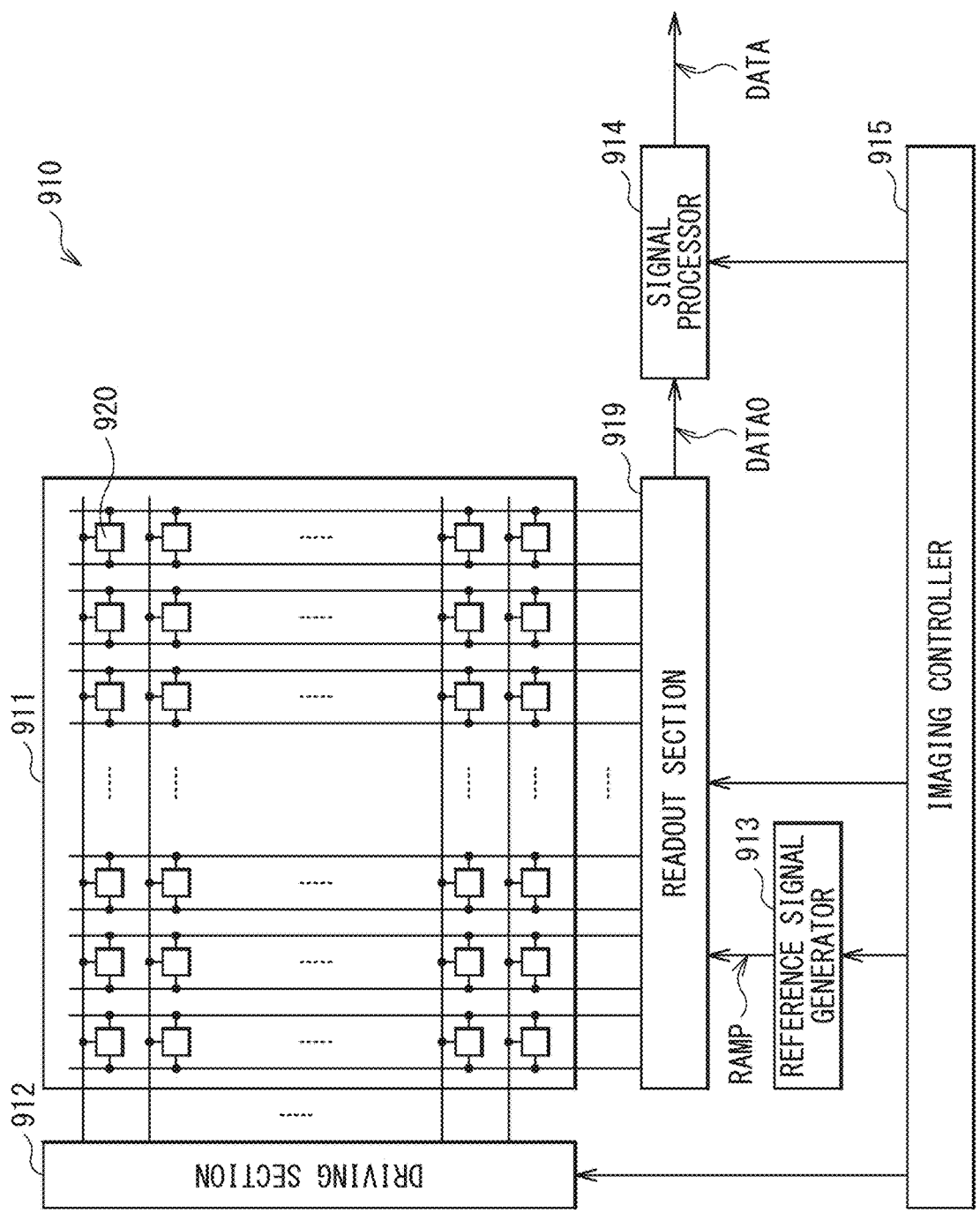
[FIG. 25]

[ FIG. 26 ]
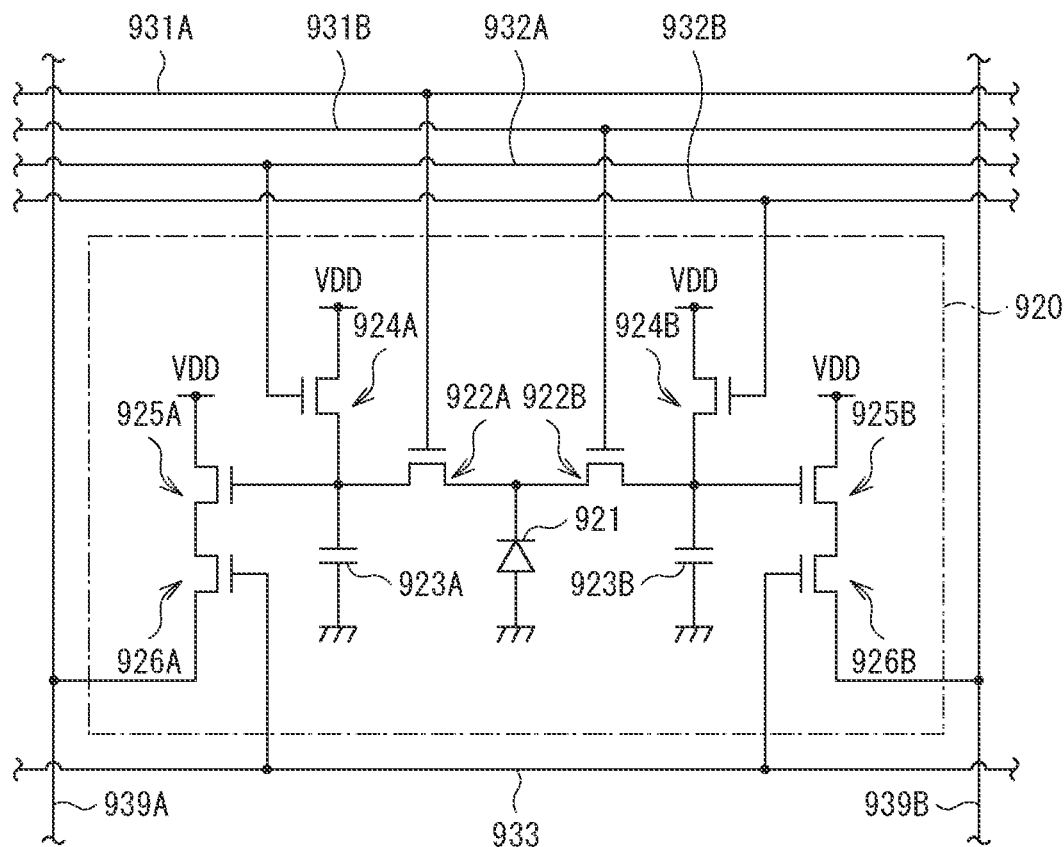
[ FIG. 27 ]
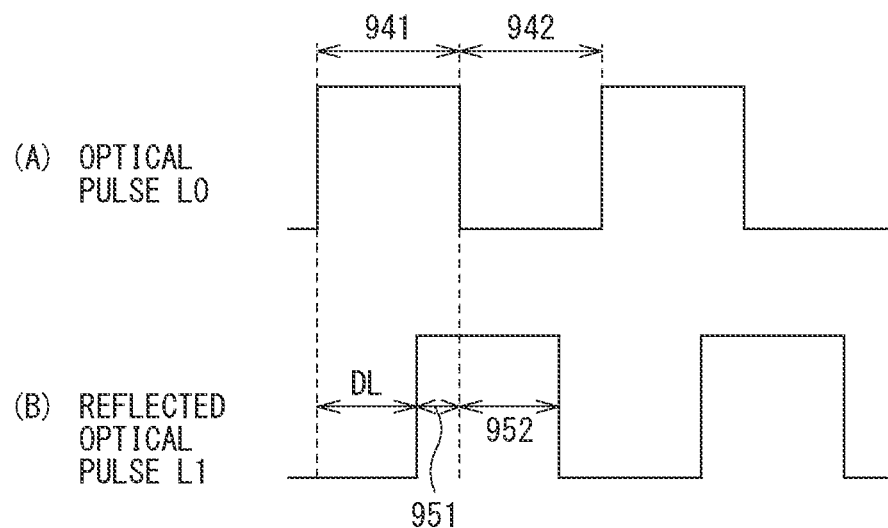

PHOTODETECTION DEVICE AND ELECTRONIC APPARATUS

TECHNICAL FIELD

The present disclosure relates to a photodetection device that is able to detect light, and an electronic apparatus including such a photodetection device.

BACKGROUND ART

In a photodetection device, frequently, a pixel generates a pixel signal corresponding to an amount of received light, and an AD (Analog to Digital) conversion circuit converts the pixel signal into a digital code. For example, PTL 1 discloses an imaging device that performs AD conversion on the basis of a signal having a ramp waveform, and a pixel signal.

CITATION LIST

Patent Literature

PTL 1: Japanese Unexamined Patent Application Publication No. 2007-19682

SUMMARY OF THE INVENTION

Incidentally, in a photodetection device, high image quality is desired, and further improvement in image quality is expected.

It is desirable to provide a photodetection device and an electronic apparatus that makes it possible to enhance image quality.

A photodetection device according to an embodiment of the present disclosure includes a first pixel, a reference signal generator, and a first converter. The first pixel is configured to generate a first pixel signal. The reference signal generator is configured to generate a reference signal. The first converter includes a first buffer circuit and a first comparison circuit and is configured to convert the first pixel signal into a digital code. The first buffer circuit is configured to output a first signal corresponding to the reference signal from an output terminal, and the first comparison circuit is configured to perform a comparison operation on the basis of the first pixel signal and the first signal.

An electronic apparatus according to an embodiment of the present disclosure includes the photodetection device described above, and corresponds to, for example, a smartphone, a digital camera, a video camera, a notebook personal computer, or the like.

In the photodetection device and the electronic apparatus according to the embodiments of the present disclosure, the first pixel generates the first pixel signal, and the reference signal generator generates the reference signal. The first buffer circuit generates the first signal corresponding to the reference signal. Then, the first comparison circuit performs the comparison operation on the basis of the first pixel signal and the first signal, and converts the first pixel signal into the digital code.

BRIEF DESCRIPTION OF DRAWINGS

FIG. 1 is a block diagram illustrating a configuration example of an imaging device according to an embodiment of the present disclosure.

FIG. 2 is a circuit diagram illustrating a configuration example of a pixel illustrated in FIG. 1.

FIG. 3 is a block diagram illustrating a configuration example of a readout section illustrated in FIG. 1.

FIG. 4A is a circuit diagram illustrating a configuration example of a buffer circuit and a comparison circuit illustrated in FIG. 3.

FIG. 4B is a circuit diagram illustrating another configuration example of the buffer circuit and the comparison circuit illustrated in FIG. 3.

FIG. 4C is a circuit diagram illustrating another configuration example of the buffer circuit and the comparison circuit illustrated in FIG. 3.

FIG. 4D is a circuit diagram illustrating another configuration example of the buffer circuit and the comparison circuit illustrated in FIG. 3.

FIG. 5 is a circuit diagram illustrating a configuration example of the readout section illustrated in FIG. 3.

FIG. 6 is an explanatory diagram illustrating an implementation example of the imaging device illustrated in FIG. 1.

FIG. 7 is an explanatory diagram illustrating another implementation example of the imaging device illustrated in FIG. 1.

FIG. 8 is a timing chart illustrating an operation example of the imaging device illustrated in FIG. 1.

FIG. 9 is a timing waveform diagram illustrating an operation example of the imaging device illustrated in FIG. 1.

FIG. 10A is a circuit diagram illustrating a configuration example of a comparison circuit according to a modification example.

FIG. 10B is a circuit diagram illustrating a configuration example of a comparison circuit according to another modification example.

FIG. 11A is a circuit diagram illustrating a configuration example of a buffer circuit according to a modification example.

FIG. 11B is a circuit diagram illustrating a configuration example of a buffer circuit according to another modification example.

FIG. 12 is a circuit diagram illustrating a configuration example of a readout section according to another modification example.

FIG. 13 is a schematic cross-sectional view of a configuration example of a plurality of transistors illustrated in FIG. 12.

FIG. 14 is a circuit diagram illustrating a configuration example of a readout section according to another modification example.

FIG. 15 is a circuit diagram illustrating a configuration example of a readout section according to another modification example.

FIG. 16 is a circuit diagram illustrating a configuration example of the readout section illustrated in FIG. 15.

FIG. 17 is a circuit diagram illustrating a configuration example of a readout section according to another modification example.

FIG. 18 is a circuit diagram illustrating a configuration example of a readout section according to another modification example.

FIG. 19A is a circuit diagram illustrating a configuration example of a comparison circuit according to another modification example.

FIG. 19B is a circuit diagram illustrating a configuration example of a comparison circuit according to another modification example.

FIG. 20A is a circuit diagram illustrating a configuration example of a comparison circuit according to another modification example.

FIG. 20B is a circuit diagram illustrating a configuration example of a comparison circuit according to another modification example.

FIG. 21 is an explanatory diagram illustrating a usage example of the imaging device.

FIG. 22 is a block diagram depicting an example of schematic configuration of a vehicle control system.

FIG. 23 is a diagram of assistance in explaining an example of installation positions of an outside-vehicle information detecting section and an imaging section.

FIG. 24 is a block diagram illustrating a configuration example of a distance measuring device according to an application example.

FIG. 25 is a block diagram illustrating a configuration example of a photodetector illustrated in FIG. 24.

FIG. 26 is a circuit diagram illustrating a configuration example of a pixel illustrated in FIG. 25.

FIG. 27 is a waveform diagram illustrating an operation example of the distance measuring device illustrated in FIG. 24.

MODES FOR CARRYING OUT THE INVENTION

Hereinafter, some embodiments of the present disclosure are described in detail with reference to the drawings. It is to be noted that description is given in the following order.

1. Embodiment
2. Usage Examples of Imaging Device
3. Application Example to Mobile Body
4. Application Example to Distance Measuring Device <1. Embodiment>
[Configuration Example]

FIG. 1 illustrates a configuration example of an imaging device 1 to which a photodetection device according to an embodiment is applied. The imaging device 1 includes a pixel array 11, a driving section 12, a reference signal generator 13, a readout section 20, a signal processor 14, and an imaging controller 15.

The pixel array 11 includes a plurality of pixels P arranged in a matrix. The pixels P each are configured to generate a pixel voltage Vpix corresponding to an amount of received light.

FIG. 2 illustrates a configuration example of the pixel P. The pixel array 11 includes a plurality of control lines TGL, a plurality of control lines RSTL, a plurality of control lines SELL, and a plurality of signal lines VSL. The control lines TGL each extend in a horizontal direction (a lateral direction in FIG. 2), and have one end coupled to the driving section 12. The control lines TGL are supplied with a control signal STG by the driving section 12. The control lines RSTL each extend in the horizontal direction, and have one end coupled to the driving section 12. The control lines RSTL are supplied with a control signal SRST by the driving section 12. The control lines SELL each extend in the horizontal direction, and have one end coupled to the driving section 12. The control lines SELL are supplied with a control signal SSEL by the driving section 12. The signal lines VSL each extend in a vertical direction (a longitudinal direction in FIG. 2), and have one end coupled to the readout section 20. The signal lines VSL each transmit a signal SIG generated by the pixel to the readout section 20. One row of a plurality of pixels P arranged side by side in the horizontal direction (the lateral direction in FIGS. 1 and 2) configures a pixel line L.

The pixels P each include a photodiode PD, a transistor TG, a floating diffusion FD, and transistors RST, AMP and SEL. The transistors TG, RST, AMP and SEL in this example are N-type MOS (Metal Oxide Semiconductor) transistors.

The photodiode PD is a photoelectric converter that generates electric charges in an amount corresponding to the amount of received light and accumulates the electric charges therein. The photodiode PD has an anode grounded, and a cathode coupled to a source of the transistor TG.

The transistor TG has a gate coupled to the control line TGL, the source coupled to the cathode of the photodiode PD, and a drain coupled to the floating diffusion FD.

The floating diffusion ED is configured to accumulate electric charges transferred from the photodiode PD via the transistor TG. The floating diffusion FD is configured by using a diffusion layer formed on a front surface of a semiconductor substrate, for example. In FIG. 2, the floating diffusion FD is illustrated with use of the symbol of a capacitor.

The transistor RST has a gate coupled to the control line RSTL, a drain supplied with a power supply voltage VDD, and a source coupled to the floating diffusion FD.

The transistor AMP has a gate coupled to the floating diffusion FD, a drain supplied with the power supply voltage VDD, and a source coupled to a drain of the transistor SEL.

The transistor SEL has a gate coupled to the control line SELL, the drain coupled to the source of the transistor AMP, and a source coupled to the signal line VSL.

With this configuration, in the pixel P, the transistor SEL is turned on on the basis of the control signal SSEL supplied to the control line SELL, thereby electrically coupling the pixel P to the signal line VSL. This causes the transistor AMP to be coupled to a constant current source CS (to be described later) of the readout section 20 and operate as a so-called source follower. Then, the pixel P outputs, to the signal line VSL, the signal SIG including a voltage corresponding to a voltage at the floating diffusion FD. Specifically, as described later, the pixel P outputs a reset voltage Vreset in a P-phase period TP of two periods (the P-phase period TP and a D-phase period TD) in which the readout section 20 performs AD conversion, and outputs a pixel voltage Vpix corresponding to the amount of received light in the D-phase period TD. The pixel P outputs the signal SIG including the reset voltage Vreset and the pixel voltage Vpix to the signal line VSL.

The driving section 12 (FIG. 1) is configured to sequentially drive the plurality of pixels P in the pixel array 11 in units of pixel lines L on the basis of an instruction from the imaging controller 15. Specifically, the driving section 12 supplies each of a plurality of control signals STG to a corresponding one of the plurality of control lines TGL in the pixel array 11, supplies each of a plurality of control signals SRST to a corresponding one of the plurality of control lines RSTL, and supplies each of a plurality of control signals SSEL to a corresponding one of the plurality of control lines SELL, thereby driving the plurality of pixels P in the pixel array 11 in units of the pixel lines L.

The reference signal generator 13 is configured to generate a reference signal RAMP on the basis of an instruction from the imaging controller 15. The reference signal RAMP has a so-called ramp waveform in which a voltage level is gradually changed with the lapse of time in the two periods (the P-phase period TP and the D-phase period TD) in which the readout section 20 performs AD conversion. The reference signal generator 13 supplies the readout section 20 with the reference signal RAMP.

The readout section 20 is configured to generate an image signal DATA0 on the basis of an instruction from the imaging controller 15 by performing AD conversion on the basis of the signals SIG supplied from the pixel array 11 via the signal lines VSL.

FIG. 3 illustrates a configuration example of the readout section 20. It is to be noted that FIG. 3 illustrates the reference signal generator 13, the signal processor 14, and the imaging controller 15 in addition to the readout section 20. The readout section 20 includes a plurality of constant current sources CS (constant current sources CS[0], CS[1], CS[2], CS[2], . . . ), a plurality of AD converters ADC (AD converters ADC[0], ADC[1], ADC[2], ADC[3], . . . ), and a transfer scanning section 29.

The plurality of constant current sources CS is provided in association with the plurality of signal lines VSL. Specifically, the 0th constant current source CS[0] is provided in association with a 0th signal line VSL[0], the first constant current source CS[1] is provided in association with a first signal line VS[1], the second constant current source CS[2] is provided in association with a second signal line VSL[2], and the third constant current source CS[3] is provided in association with a third signal line VSL[3]. The same applies to fourth and subsequent constant current sources CS. The constant current sources CS each have one end coupled to a corresponding signal line VSL, and another end grounded. Each of the plurality of constant current sources CS is configured to apply a predetermined current to a corresponding signal line VSL.

The plurality of AD converters ADC is provided in association with the plurality of signal lines VSL. Specifically, the 0th AD converter ADC[0] is provided in association with the 0th signal line VSL[0], the first AD converter ADC[1] is provided in association with the first signal line VSL[1], the second AD converter ADC[2] is provided in association with the second signal line VSL[2], and the third AD converter ADC[3] is provided in association with the third signal line VSL[2]. The same applies to fourth and subsequent AD converters ADC. Each of the plurality of AD converters ADC is configured to convert a voltage of the signal SIG into a digital code CODE by performing AD conversion on the basis of the signal SIG supplied from the pixel array 11. The AD converters ADC each include a buffer circuit 21, a comparison circuit 22, a counter 23, and a latch 24.

The buffer circuit 21 is configured to generate a reference signal RAMP1 on the basis of the reference signal RAMP.

The comparison circuit 22 is configured to generate a signal CMPO by performing a comparison operation on the basis of the reference signal RAMP1 supplied from the buffer circuit 21 and the signal SIG supplied from the pixel P via the signal line VSL. The comparison circuit 22 sets an operation point on the basis of control signals AZSW and AZN supplied from the imaging controller 15, and thereafter performs a comparison operation.

FIG. 4A illustrates a configuration example of the buffer circuit 21 and the comparison circuit 22. The buffer circuit 21 is supplied with a power supply voltage VDD1, a ground voltage VSS1, and a bias voltage VB1. The comparison circuit 22 is supplied with a power supply voltage VDD2, a ground voltage VSS2, and a bias voltage VB2. In this example, the power supply voltage VDD1 is a voltage higher than the power supply voltage VDD2. It is to be noted that this is not limitative, and the power supply voltage VDD1 may be the same voltage as the power supply voltage VDD2, for example.

The buffer circuit 21 includes transistors MP1 and MP2. The transistors MP1 and MP2 are P-type MOS transistors. The transistor MP1 has a gate supplied with the reference signal RAMP, a drain supplied with the ground voltage VSS1, and a source coupled to a drain of the transistor MP2 and the comparison circuit 22. The transistor MP2 has a gate supplied with the bias voltage VB1, the drain coupled to the source of the transistor MP1 and the comparison circuit 22, and a source supplied with the power supply voltage VDD1. The transistor MP2 operates as a constant current source. Although not illustrated, in this example, back gates of the transistors MP1 and MP2 are supplied with the power supply voltage VDD1. With this configuration, the buffer circuit 21 operates as a so-called source follower, thereby generating the reference signal RAMP1 on the basis of the reference signal RAMP.

The comparison circuit 22 includes capacitors C1 and C2, transistors MP11, MN11, MP12, and MN12, switches SW1 and SW2, and a capacitor C3. The transistors MP11 and MP12 are P-type MOS transistors, and the transistors MN11 and MN12 are N-type MOS transistors.

The capacitors C1 and C2 each have one end (a terminal T1) and another end (a terminal T2). The capacitor C1 has the one end coupled to the buffer circuit 21 and the other end coupled to the other end of the capacitor C2, a gate of the transistor MP11, and one end of the switch SW1. The one end of the capacitor C1 is supplied with the reference signal RAMP1 generated by the buffer circuit 21. The capacitor C2 has the one end coupled to the signal line VSL, and the other end coupled to the other end of the capacitor C1, the gate of the transistor MP11, and the one end of the switch SW1. The one end of the capacitor C2 is supplied with the pixel signal SIG generated by the pixel P.

The transistor MP11 has the gate coupled to the other ends of the capacitors C1 and C2 and the one end of the switch SW1, a drain coupled to a drain of the transistor MN11, a gate of the transistor MP12, and another end of the switch SW1, and the source supplied with the power supply voltage VDD2. The transistor MN11 has a gate supplied with the bias voltage VB2, the drain coupled to the drain of the transistor MP11, the gate of the transistor MP12, and the other end of the switch SW1, and a source supplied with the ground voltage VSS2. The transistor MN11 is a load of the transistor MP11, and operates as a constant current source. The switch SW1 is configured to be turned on and off on the basis of the control signal AZSW, and has the one end coupled to the other ends of the capacitors C1 and C2 and the gate of the transistor MP11, and the other end coupled to the drains of the transistors MP11 and MN11 and the gate of the transistor MP12. The transistors MP11 and MN11, and the switch SW1 are included in an initial-stage circuit 101 of the comparison circuit 22.

The transistor MP12 has the gate coupled to the drains of the transistors MP11 and MN11 and the other end of the switch SW1, a drain coupled to a drain of the transistor MN12 and one end of the switch SW2, and a source supplied with the power supply voltage VDD2. The transistor MN12 has a gate coupled to one end of the capacitor C3 and another end of the switch SW2, the drain coupled to the drain of the transistor MP12 and the one end of the switch SW2, and a source supplied with the ground voltage VSS2. The switch SW2 is configured to be turned on and off on the basis of the control signal AZN, and has the one end coupled to the drains of the transistors MP12 and MN12, and the other end coupled to the gate of the transistor MN12 and the one end of the capacitor C3. The capacitor C3 has the one end coupled to the gate of the transistor MN12 and the other end of the switch SW2, and another end supplied with the ground voltage VSS2. It is to be noted that the capacitor C3 may be configured by using a MOS capacitor or the like, or may be configured by using a parasitic capacitance at the gate of the transistor MN12, a parasitic capacitance at the switch SW2, a parasitic capacitance at a wiring line, or the like, for example. The transistors MP12 and MN12, the switch SW2, and the capacitor C3 are included in a post-stage circuit 102 of the comparison circuit 22.

With this configuration, the comparison circuit 22 performs a comparison operation on the basis of the signal SIG and the reference signal RAMP1. Specifically, in the comparison circuit 22, as described later, the operation point is set by turning on the switches SW1 and SW2. Then, the comparison circuit 22 performs a comparison operation on the basis of the reference signal RAMP1 and the reset voltage Vreset included in the signal SIG in the P-phase period TP, and performs a comparison operation on the basis of the reference signal RAMP1 and the pixel voltage Vpix included in the signal SIG in the D-phase period TD.

It is to be noted that in this example, the buffer circuit 21 is configured by using two P-type MOS transistors as illustrated in FIG. 4A, but this is not limitative. As with a buffer circuit 21A illustrated in FIG. 4B, the buffer circuit 21 may be configured by using two N-type MOS transistors. The buffer circuit 21A includes two transistors MN1 and MN2. The transistors MN1 and MN2 are N-type MOS transistors. The transistor MN1 has a gate supplied with the reference signal RAMP, a drain supplied with the power supply voltage VDD1, and a source coupled to a drain of the transistor MN2 and the comparison circuit 22. The transistor MN2 has a gate supplied with a bias voltage VB3, the drain coupled to the source of the transistor MN1 and the comparison circuit 22, and a source supplied with the ground voltage VSS1. Although not illustrated, in this example, back gates of the transistors MN1 and MN2 are supplied with the ground voltage VSS1.

In addition, in this example, the comparison circuit 22 is configured as illustrated in FIG. 4A, but this is not limitative. The comparison circuit 22 may be configured like a comparison circuit 22A illustrated in FIG. 4C. The comparison circuit 22A includes capacitors C4 and C5, transistors MN13, MP13, MN14, and MP14, switches SW3 and SW4, and a capacitor C6. The transistors MP13 and MP14 are P-type MOS transistors, and the transistors MN13 and MN14 are N-type MOS transistors.

The capacitors C4 and C5 each have one end and another end. The capacitor C4 has the one end coupled to the buffer circuit 21 and the other end coupled to the other end of the capacitor C5, a gate of the transistor MN13, and one end of the switch SW3. The one end of the capacitor C4 is supplied with the reference signal RAMP1 generated by the buffer circuit 21. The capacitor C5 has the one end coupled to the signal line VSL and the other end coupled to the other end of the capacitor C4, the gate of the transistor MN13, and the one end of the switch SW3. The one end of the capacitor C5 is supplied with the pixel signal SIG generated by the pixel P.

The transistor MN13 has the gate coupled to the other ends of the capacitors C4 and C5, and the one end of the switch SW3, and a drain coupled to a drain of the transistor MP13, a gate of the transistor MN14, and another end of the switch SW3, and a source supplied with the ground voltage VSS2. The transistor MP13 has a gate supplied with a bias voltage VB4, the drain coupled to the drain of the transistor MN13, the gate of the transistor MN14, the other end of the switch SW3, and a source supplied with the power supply voltage VDD2. The transistor MP13 is a load of the transistor MN13, and operates as a constant current source. The switch SW3 is configured to be turned on and off on the basis of the control signal AZSW, and has the one end coupled to the other ends of the capacitors C4 and C5 and the gate of the transistor MP13, and the other end coupled to the drains of the transistors MN13 and MP13 and the gate of the transistor MN14.

The transistor MN14 has the gate coupled to the drains of the transistors MN13 and MP13 and the other end of the switch SW3, a drain coupled to a drain of the transistor MP14 and one end of the switch SW4, and a source supplied with the ground voltage VSS2. The transistor MP11 has a gate coupled to one end of the capacitor C6, another end of the switch SW4, the drain coupled to the drain of the transistor MN14 and the one end of the switch SW4, and a source supplied with the power supply voltage VDD2. The switch SW4 is configured to be turned on and off on the basis of the control signal AZN, has the one end coupled to the drains of the transistors MN14 and MP14 and the other end coupled to the gate of the transistor MP14 and the one end of the capacitor C6. The capacitor C6 has the one end coupled to the gate of the transistor MP14 and the other end of the switch SW4 and another end supplied with the power supply voltage VDD1.

In addition, as illustrated in FIG. 4D, the buffer circuit 21A illustrated in FIG. 4B and the comparison circuit 22A illustrated in FIG. 4C may be combined.

FIG. 5 illustrates a coupling example of the reference signal generator 13, the buffer circuit 21, and the comparison circuit 22. It is to be noted that in this drawing, the transistor MP2 of the buffer circuit 21 and the transistor MN11 of the comparison circuit 22 are illustrated with use of the symbol of a constant current source, and the post-stage circuit 102 (the transistors MP12 and MN12, the switch SW2, and the capacitor C3) of the comparison circuit 22 is illustrated with use of the symbol of an amplifier circuit.

As illustrated in FIG. 5, the reference signal generator 13 generates the reference signal RAMP, and supplies the generated reference signal RAMP to a plurality of buffer circuits 21. Each of the plurality of buffer circuits 21 generates the reference signal RAMP1 on the basis of the reference signal RAMP, and supplies the generated reference signal RAMP1 to the comparison circuit 22 corresponding to that buffer circuit 21. The comparison circuit 22 performs a comparison operation on the basis of the reference signal RAMP1, and the signal SIG supplied via a corresponding one of the signal lines VSL to generate the signal CMPO.

The counter 23 (FIG. 3) is configured to perform a counting operation on the basis of the signal CMPO supplied from the comparison circuit 22 and the control signal CTL supplied from the imaging controller 15. In the counting operation, pulses of a clock signal CLK supplied from the imaging controller 15 are counted.

The latch 24 is configured to generate the digital code CODE on the basis of a count value obtained by the counter 23 and hold the digital code CODE. Specifically, the latch 24 generates the digital code CODE corresponding to a difference (CNTD-CNTP) between a count value CNTP obtained by the counter 23 in the P-phase period TP and a count value CNTD obtained by the counter 23 in the D-phase period TD. Then, the latch 24 outputs the digital code CODE to a bus wiring line BUS on the basis of a control signal supplied from the transfer scanning section 29.

The transfer scanning section 29 is configured to perform control on the basis of a control signal CTL2 supplied from the imaging controller 15 to cause the latches 24 of the plurality of AD converters ADC to sequentially output the digital codes CODE to the bus wiring line BUS. The readout section 20 sequentially transfers, to the signal processor 14, a plurality of digital codes CODE supplied from the plurality of AD converter ADC as the image signal DATA0 with use of the bus wiring line BUS.

The signal processor 14 (FIG. 1) is configured to generate an image signal DATA on the basis of an instruction from the imaging controller 15 by performing predetermined signal processing on the image signal DATA0, and output the image signal DATA.

The imaging controller 15 is configured to supply a control signal to the driving section 12, the reference signal generator 13, the readout section 20, and the signal processor 14, and control operations of these circuits, thereby controlling an operation of the imaging device 1. Specifically, the imaging controller 15 supplies a control signal to the driving section 12, thereby performing control to cause the driving section 12 to sequentially drive the plurality of pixels P in the pixel array 11 in units of the pixel lines L. In addition, the imaging controller 15 supplies a control signal to the reference signal generator 13, thereby performing control to cause the reference signal generator 13 to generate the reference signal RAMP. In addition, the imaging controller 15 supplies the power supply voltages VDD1 and VDD2, the ground voltages VSS1 and VSS2, and the bias voltages VB1 and VB2 to the readout section 20, and supplies the control signals AZSW, AZN, CTL, and CTL2, and the clock signal CLK to the readout section 20, thereby performing control to cause the readout section 20 to generate the image signal DATA0 by performing AD conversion on the basis of the signal SIG. In addition, the imaging controller 15 controls the operation of the signal processor 14 by supplying a control signal to the signal processor 14.

Next, description is given of implementation of the imaging device 1. In the imaging device 1, for example, each of blocks illustrated in FIG. 1 may be formed in one semiconductor substrate, or may be formed in a plurality of semiconductor substrates.

FIG. 6 illustrates an implementation example of the imaging device 1 in a case where the blocks are formed in one semiconductor substrate 200. In the semiconductor substrate 200, the pixel array 11 is disposed, and the driving section 12 is disposed on the left of the pixel array 11. In addition, the readout section 20 is disposed below the pixel array 11. In the readout section 20, a constant current source section 201 including the plurality of constant current sources CS, a comparison circuit section 202 including the plurality of buffer circuits 21 and the plurality of comparison circuits 22, a counter section 203 including a plurality of counters 23, a latch section 204 including a plurality of latches 24, and the transfer scanning section 29 are disposed in this order from top. The reference signal generator 13 and the imaging controller 15 are disposed on the left of the readout section 20. In addition, the signal processor 14 is disposed on the right of the pixel array 11 and the readout section 20.

FIG. 7 illustrates an implementation example of the imaging device 1 in a case where the blocks are formed in two semiconductor substrates 211 and 212. For example, the pixel array 11 is disposed in the semiconductor substrate 211, and the readout section 20, the driving section 12, the reference signal generator 13, the signal processor 14, and the imaging controller 15 are disposed in the semiconductor substrate 212. The semiconductor substrates 211 and 212 are superimposed on each other. Then, the plurality of signal lines VSL disposed in the semiconductor substrate 211 is electrically coupled to the readout section 20 disposed in the semiconductor substrate 212 via, for example, a TSV (Through Silicon Via), and the plurality of control lines TGL, the plurality of control lines RSTL, and the plurality of control lines SELL disposed in the semiconductor substrate 211 are electrically coupled to the driving section 12 disposed in the semiconductor substrate 212 via, for example, a TSV. The readout section 20 is disposed in the semiconductor substrate 212, and the driving section 12, the reference signal generator 13, and the imaging controller 15 are disposed on the left of the readout section 20, and the signal processor 14 is disposed on the right of the readout section 20. In the readout section 20, the constant current source section 201 including the plurality of constant current sources CS, the comparison circuit section 202 including the plurality of buffer circuits 21 and the plurality of comparison circuits 22, the counter section 203 including the plurality of counters 23, the latch section 204 including the plurality of latches 24, and the transfer scanning section 29 are disposed in this order from top.

In a case where the blocks are formed in two semiconductor substrates 211 and 212 in such a manner (FIG. 7), disposing the pixel array 11 mainly in the semiconductor substrate 211 makes it possible to manufacture the semiconductor substrate 211 by using a semiconductor manufacturing process specific to pixels. That is, the semiconductor substrate 211 includes no circuit but the pixel array 11; therefore, for example, even in a case where a specific manufacturing process is used to form pixels, the manufacturing process does not affect circuits other than the pixel array 11. Accordingly, in the imaging device 1, it is possible to use the semiconductor manufacturing process specific to formation of pixels, which makes it possible to enhance imaging characteristics in the imaging device 1.

Here, the pixel P corresponds to a specific example of a "first pixel" in the present disclosure. The AD converter ADC corresponds to a specific example of a "first converter" in the present disclosure. The buffer circuit 21 corresponds to a specific example of a "first buffer circuit" in the present disclosure. The comparison circuit 22 corresponds to a specific example of a "first comparison circuit" in the present disclosure. The transistor MP11 corresponds to a specific example of a "first transistor" in the present disclosure. The capacitor C1 corresponds to a specific example of a "first capacitor" in the present disclosure. The capacitor C2 corresponds to a specific example of a "second capacitor" in the present disclosure. The switch SW1 corresponds to a specific example of a "first switch" in the present disclosure. The transistor MN11 corresponds to a specific example of a "first load transistor" in the present disclosure. The transistor MP12 corresponds to a specific example of a "second transistor" in the present disclosure. The transistor MN12 corresponds to a specific example of a "third transistor" in the present disclosure. The switch SW2 corresponds to a specific example of a "second switch" in the present disclosure. The transistor MP1 corresponds to a specific example of a "first buffer transistor" in the present disclosure. The transistor MP2 corresponds to a specific example of a "first current source" in the present disclosure.

[Operations and Workings]

Next, description is given of an operation and workings of the imaging device 1 according to the present embodiment.

(Overview of Overall Operation)

First, an overview of the overall operation of the imaging device 1 is described with reference to FIG. 1. The driving section 12 sequentially drives the plurality of pixels P1 in the pixel array 11 in units of the pixel lines L on the basis of an instruction from the imaging controller 15. The pixels P each output the reset voltage Vrest as the signal SIG in the P-phase period TP, and output the pixel voltage Vpix corresponding to the amount of received light as the signal SIG in the D-phase period TD. The reference signal generator 13 generates the reference signal RAMP on the basis of an instruction from the imaging controller 15. The readout section 20 generates the imaging signal DMTA0 on the basis of an instruction from the imaging controller 15 by performing AD conversion on the basis of the signal SIG supplied from the pixel array 11 via the signal line VSL. The signal processor 14 generates the imaging signal DATA on the basis of an instruction from the imaging controller 15 by performing predetermined signal processing on the imaging signal DAT0. The imaging controller 15 supplies a control signal to the driving section 12, the reference signal generator 13, the readout section 20, and the signal processor 14, and controls operations of these circuits, thereby controlling the operation of the imaging device 1.

(Detailed Operation)

In the imaging device 1, the plurality of pixels P each accumulates electric charges corresponding to the amount of received light, acid outputs the pixel voltage Vpix corresponding to the amount of received light as the signal SIG. Then, the readout section 20 performs AD conversion on the basis of the signal SIG. This operation is described in detail below.

FIG. 8 illustrates an example of an operation of scanning the plurality of pixels P in the pixel array 11.

The imaging device 1 performs exposure start driving D1 on the pixel array 11 in order from top in the vertical direction in a period from a timing t0 to a timing t1. Specifically, the driving section 12 generates, for example, the control signals STG and SRST, thereby sequentially selecting the pixel lines L, and sequentially turning on the transistors TG and RST in the pixels P in a time having a predetermined length. This sets a voltage of the floating diffusion FD and a voltage of the cathode of the photodiode PD to the power supply voltage VDD in each of the pixels P. Then, the transistors TG and RST are turned off, which causes the photodiode PD to start to accumulate electric charges in accordance with the amount of received light. Thus, in the plurality of pixels P, an exposure period T sequentially starts.

The imaging device 1 performs readout driving D2 on the pixel array 11 in order from top in the vertical direction in a period from a timing t2 to a timing t3. Specifically, the driving section 12 sequentially selects the pixel lines L by generating the control signals STG and SRST, as described later. This causes the pixels P to output the reset voltage Vreset as the signal SIG in the P-phase period TP and output the pixel voltage Vpix as the signal SIG in the D-phase period TD. The readout section 20 generates the digital code CODE by performing AD conversion on the basis of the signals SIG.

The imaging device 1 repeats such exposure start driving D1 and such readout driving D2. Thus, the imaging device 1 obtains captured images.

Next, the readout driving D2 is described in detail. In the following, with a focus on a certain pixel P (a pixel P1) of the plurality of pixels P, detailed description is given of operations of the pixel P1 and the AD converter ADC (an AD converter ADC1) coupled to the pixel P1.

FIG. 9 illustrates an operation example of the readout driving D2 in the pixel P1 of interest, where (A) indicates a waveform of the control signal SSEL, (B) indicates a waveform of the control signal SRST, (C) indicates a waveform of the control signal STG, (D) indicates a waveform of the signal SIG, (E) indicates a waveform of the control signal AZSW, (F) indicates a waveform of the reference signal RAMP, (G) indicates a waveform of a gate voltage Vg of the transistor MP11 in the comparison circuit 22 of the AD converter ADC1, and (H) indicates a waveform of the signal CMPO in the AD converter ADC1. A waveform of the control signal AZN is similar to the waveform of the control signal AZSW.

In the imaging device 1, in a certain horizontal period (H), first, the pixel P1 outputs the reset voltage Vrest by performing an reset operation, and the AD converter ADC1 performs AD conversion on the basis of the reset voltage Vreset in the P-phase period TP. Then, the pixel P1 thereafter performs an electric charge transfer operation, thereby outputting the pixel voltage Vpix, and the AD converter ADC1 performs AD conversion on the basis of the pixel voltage Vpix in the D-phase period TD. This operation is described in detail below.

First, at a timing t11, upon start of the horizontal period H, the driving section 12 changes the voltage of the control signal SSEL from a low level to a high level ((A) of FIG. 9). This turns on the transistor SEL in the pixel P1, and the pixel P1 is electrically coupled to the signal line VSL. In addition, at the timing t11, the driving section 12 changes the voltage of the control signal SRST from the low level to the high level ((B) of FIG. 9). This turns on the transistor RST in the pixel P1, and sets the voltage of the floating diffusion FD to the power supply voltage VDD (a reset operation). Then, the pixel P1 outputs a voltage (the reset voltage Vreset) corresponding to the voltage of the floating diffusion FD at this time. Thus, the voltage of the signal SIG is changed to the reset voltage Vreset ((D) of FIG. 9).

In addition, at the timing t11, the reference signal generator 13 changes the reference signal RAMP to a voltage V1 ((F) of FIG. 9). In addition, at the timing t11, the imaging controller 15 changes the voltages of the control signals AZSW and AZN from the low level to the high level ((E) of FIG. 9). This turns on both the switches SW1 and SW2 in the comparison circuit 22 of the AD converter ADC1. Turning on the switch SW1 changes the gate voltage Vg of the transistor MP11 to the same voltage (a voltage V2) as a drain voltage of the transistor MP11 ((G) of FIG. 9) to set the voltages of the capacitors C1 and C2. In addition, turning on the switch SW2 changes a gate voltage of the transistor MN12 to the same voltage as a drain voltage of the transistor MN12 to set the voltage of the capacitor C3. This changes the voltage of the signal CMPO to a voltage V3 ((H) of FIG. 9). Thus, the comparison circuit 22 performs an operation point setting operation.

Next, at a timing t12, the driving section 12 changes the voltage of the control signal SRST from the high level to the low level ((B) of FIG. 9). This turns off the transistor RST in the pixel P1.

Next, at a timing t13, the imaging controller 15 changes the voltages of the control signals AZSW and AZN from the high level to the low level ((E) of FIG. 9). This turns off both the switches SW1 and SW2 in the comparison circuit 22 of the AD converter ADC1, and the operation point setting operation ends. From this point onward, the comparison circuit 22 operates to compare the gate voltage Vg with the voltage V2.

Next, at a timing t14, the reference signal generator 13 decreases the voltage of the reference signal RAMP from the voltage V1 to a voltage V4 ((F) of FIG. 9). This changes the gate voltage Vg of the transistor MP11 to a voltage lower than the voltage V2 ((G) of FIG. 9) in the comparison circuit 22 of the AD converter ADC1, which decreases the voltage of the signal CMPO ((H) of FIG. 9). In other words, the comparison circuit 22 compares the gate voltage Vg with the voltage V2, and the gate voltage Vg is lower than the voltage V2, thereby changing the voltage of the signal CMPO to the low level.

Next, in a period from a timing t15 to a timing t17 (the P-phase period TP), the AD converter ADC1 performs AD conversion on the basis of the reset voltage Vreset. Specifically, first, at the timing t15, the reference signal generator 13 starts to increase the voltage of the reference signal RAMP from the voltage V4 at a predetermined change rate ((F) of FIG. 9). Accordingly, in the comparison circuit 22 of the AD converter ADC1, the gate voltage Vg of the transistor MP11 starts to increase ((G) of FIG. 9). In addition, at the timing t15, the imaging controller 15 starts generation of the clock signal CLK. The counter 23 of the AD converter ADC1 performs the counting operation to count pulses of the clock signal CLK.

Then, at a timing t16, the gate voltage Vg exceeds the voltage V2 ((G) of FIG. 9. Accordingly, the comparison circuit 22 of the AD converter ADC1 changes the voltage of the signal CMPO from the low level to the high level ((H) of FIG. 9). That is, the comparison circuit 22 compares the gate voltage Vg with the voltage V2, and the gate voltage Vg exceeds the voltage V2, thereby changing the voltage of the signal CMPO from the low level to the high level. The counter 23 of the AD converter ADC1 stops the counting operation on the basis of this transition of the signal CMPO. At this time, the count value of the counter 23 is CNTP. The latch 24 of the AD converter ADC1 latches this count value CNTP as a count value in the P-phase period TP. Then, the counter 23 is reset.

Next, at the timing t17, the reference signal generator 13 sets the voltage of the reference signal RAMP to the voltage V1 at the end of the P-phase period TP. In addition, the imaging controller 15 stops generation of the clock signal CLK at the timing t17.

Then, at the timing t17, the driving section 12 changes the voltage of the control signal STG from the low level to the high level ((C) of FIG. 9). This turns on the transistor TG in the pixel P1, and electric charges generated in the photodiode PD are transferred to the floating diffusion FD (an electric charge transfer operation). Then, the pixel P1 outputs a voltage (the pixel voltage Vpix) corresponding to the voltage of the floating diffusion FD at this time. Thus, the voltage of the signal SIG is changed to the pixel voltage Vpix ((D) of FIG. 9). FIG. 9 illustrates two pixel voltages Vpix (pixel voltages Vpix1 and Vpix2) different from each other as an example. The voltage of the signal SIG is decreased in such a manner, which decreases the gate voltage Vg of the transistor MP11 in the comparison circuit 22 of the AD converter ADC1 ((G) of FIG. 9). The gate voltage Vg is changed by a voltage corresponding to the pixel voltage Vpix. The gate voltage Vg is decreased in such a manner, which decreases the voltage of the signal CMPO ((H) of FIG. 9). That is, the comparison circuit 22 compares the gate voltage Vg with the voltage V2, and the gate voltage Vg is lower than the voltage V2, thereby changing the voltage of the signal CMPO to the low level.

Next, at a timing t18, the driving section 12 changes the voltage of the control signal STG from the high level to the low level ((C) of FIG. 9). This turns off the transistor TG in the pixel P1.

Next, at a timing t19, the reference signal generator 13 decreases the voltage of the reference signal RAMP from the voltage V1 to the voltage V4 ((F) of FIG. 9). This decreases the gate voltage Vg of the transistor MP11 in the comparison circuit 22 of the AD converter ADC1 ((G) of FIG. 9).

Next, in a period from a timing t20 to a timing t23 (the D-phase period TD), the AD converter ADC1 performs AD conversion on the basis of the pixel voltage Vpix. Specifically, first, at the timing t20, the reference signal generator 13 starts to increase the voltage of the reference signal RAMP from the voltage V4 at a predetermined change rate ((F) of FIG. 9). Accordingly, in the comparison circuit 22 of the AD converter ADC1, the gate voltage Vg of the transistor MP11 starts to increase ((G) of FIG. 9). In addition, at the timing t20, the imaging controller 15 starts generation of the clock signal CLK. The counter 23 of the AD converter ADC1 performs the counting operation to count pulses of the clock signal CLK.

In a case where the pixel voltage Vpix is the voltage Vpix1, the gate voltage Vg exceeds the voltage V2 at the timing t21 ((G) of FIG. 9). Accordingly, the comparison circuit 22 of the AD converter ADC1 changes the voltage of the signal CMPO from the low level to the high level ((H) of FIG. 9). That is, the comparison circuit 22 compares the gate voltage Vg with the voltage V2, and the gate voltage Vg exceeds the volage V2, thereby changing the voltage of the signal CMPO from the low level to the high level.

In addition, in a case where the pixel voltage Vpix is the voltage Vpix2, the gate voltage Vg exceeds the voltage V2 at a timing t22 ((G) of FIG. 9). Accordingly, the comparison circuit 22 of the AD converter ADC1 changes the voltage of the signal CMPO from the low level to the high level ((H) of FIG. 9).

The counter 23 of the AD converter ADC1 stops the counting operation on the basis of this transition of the signal CMPO. At this time, the count value of the counter 23 is CNTD. The latch 24 of the AD converter ADC1 latches the count value CNTD as a count value in the D-phase period TD. Then, the counter 23 is reset.

Next, at a timing t23, the reference signal generator 13 sets the voltage of the reference signal RAMP to the voltage V1 at the end of the D-phase period TD ((F) of FIG. 9). In addition, the imaging controller 15 stops generation of the clock signal CLK at the timing t23. Then, the driving section 12 changes the voltage of the control signal SSEL from the high level to the low level at the timing t23 ((A) of FIG. 9). This turns off the transistor SEL in the pixel P1, which electrically separates the pixel P1 from the signal line SGL.

Then, the latch 24 of the AD converter ADC1 generates the digital code CODE corresponding to a difference (CNTD-CNTP) between the count value CNTP obtained by the counter 23 in the P-phase period TP and the count value CNTD obtained by the counter 23 in the D-phase period TD.

As described above, in the imaging device 1, the counting operation is performed on the basis of the reset voltage Vreset in the P-phase period TP to obtain the count value CNTP, and the counting operation is performed on the basis of the pixel voltage Vpix in the D-phase period TD to obtain the count value CNTD. Then, in the imaging device 1, the digital code CODE corresponding to the difference (CNTD-CNTP) between the count values CNTP and CNTD is generated. In the imaging device 1, such correlated double sampling is performed, which makes it possible to remove a noise component included in the pixel voltage Vpix. As a result, it is possible to enhance image quality of a captured image.

As described above, in the imaging device 1, each of the plurality of AD converters ADC includes the butler circuit 21. This makes it possible to suppress interference among the plurality of AD converters ADC. That is, for example, in a case where the buffer circuit 21 is not provided in each of the plurality of AD converters ADC, upon transition of the signal CMPO by the comparison circuit 22 in a certain AD converter ADC, noise may be generated in the reference signal RAMP. In this case, the noise may affect operations of other AD converters ADC. In the imaging device 1, the buffer circuit 21 is provided in each of the plurality of AD converters ADC, which makes it possible to reduce a possibility that noise is generated in the reference signal RAMP. This makes it possible to reduce a possibility that the operation of a certain AD converter ADC affects operations of other AD converters ADC. This makes it possible to reduce, for example, a possibility that streaking occurs in a captured image in the imaging device 1. As a result, it is possible to enhance image quality of a captured image in the imaging device 1.

In addition, in the imaging device 1, the comparison circuit 22 combines the voltage of the signal SIG and the voltage of the reference signal RAMP1 with use of the capacitors C1 and C2, and performs a comparison operation on the basis of a thus—combined voltage. Accordingly, in the imaging device 1, for example, noise generated in the buffer circuit 21A is voltage-divided by the capacitors C1 and C2, which makes it possible to reduce a noise component. This makes it possible to suppress an influence of the noise generated in the buffer circuit 21A on the comparison operation. As a result, it is possible to reduce a possibility of a reduction in image quality of a captured image in the imaging device 1.

[Effects]

As described above, in the present embodiment, each of the plurality of AD converters includes the buffer circuit, which makes it possible to enhance image quality of a captured image.

In the present embodiment, in the comparison circuit, the voltage of the signal SIG and the voltage of the reference signal RAMP1 are combined with use of the capacitors C1 and C2, and the comparison operation is performed on the basis of a thus—combined voltage, which makes it possible to reduce a possibility of a reduction in image quality of a captured image.

Modification Example 1

In the embodiment described above, for example, four transistors MP11, MN11, MP12, and MN12 are provided in the comparison circuit 22 (FIG. 4A), but this is not limitative. For example, as with a comparison circuit 22B illustrated in FIG. 10A, a transistor MN15 may be further provided. The transistor MN15 is an N-type MOS transistor, and has a gate supplied with the signal CMPO, a drain supplied with the power supply voltage VDD2, and a source coupled to the drains of the transistors MP11 and MN11, the gate of the transistor MP12, and the other end of the switch SW1. The transistor MN15 performs control on the basis of the voltage of the signal CMPO to prevent the drain voltage of the transistor MN11 that operates as a constant current source from becoming too low. This makes it possible to maintain constant-current properly in the transistor MN11 and suppress interference among the plurality of AD converters ADC, for example.

In this example, the present modification example is applied to the comparison circuit 22 (FIG. 4A), but the present modification example may be applied to the comparison circuit 22A (FIG. 4C), for example. Specifically, for example, as with a comparison circuit 22C illustrated in FIG. 10B, a transistor MP15 may be provided. The transistor MP15 is a P-type MOS transistor, and has a gate supplied with the signal CMPO, a drain supplied with the ground voltage VSS2, and a source coupled to the drains of the transistors MN13 and MP13, the gate of the transistor MN14, and the other end of the switch SW3. The transistor MP15 performs control on the basis of the voltage of the signal CMPO to prevent the drain voltage of the transistor MP13 that operates as a constant current source from becoming too high. This makes it possible to maintain constant-current property in the transistor MP13 and suppress interference among the plurality of AD converters ADC, for example.

Modification Example 2

In the embodiment described above, the back gate of the transistor MP1 of the butler circuit 21 is supplied with the power supply voltage VDD1, but this is not limitative. Instead of this, for example, as with a buffer circuit 21B illustrated in FIG. 11A, the back gate of the transistor MP1 may be coupled to the source of this transistor MP1. This makes it possible to decrease an absolute value of the gate-source voltage Vgs of the transistor MP1, which makes it possible to further decrease the power supply voltage VDD1 and reduce power consumption, for example. In addition, it is possible to bring a gain of the buffer circuit 21B that operates as a source follower close to 0 dB, and it is possible to enhance linearity.

In this example, the present modification example is applied to the buffer circuit 21 (FIG. 4A), but the present modification example may be applied to the buffer circuit 21A (FIG. 4B), for example. Specifically, as with a buffer circuit 21C illustrated in FIG. 11B, the back gate of the transistor MN1 may be coupled to the source of this transistor MN1. This makes it possible to decrease the gate-source voltage Vgs of the transistor MN1, which makes it possible to further decrease the power supply voltage VDD1 and reduce power consumption, for example. In addition, it is possible to bring a gain of the buffer circuit 21C that operates as a source follower close to 0 dB, and it is possible to enhance linearity.

Modification Example 3

In addition, the back gates of the transistors MP1 in the buffer circuits of the plurality of AD converters ADC may be coupled to each other. The present modification example is described below with reference to some examples.

FIG. 12 illustrates a configuration example of a readout section 20D in an imaging device 1D according to the present modification example. The readout section 20D includes a plurality of buffer circuits 21D and a voltage generator 16D. The back gates of the transistors MP1 of the plurality of buffer circuits 21D are coupled to each other. The back gates of these transistors MP1 are supplied with the direct-current voltage VDC.

FIG. 13 illustrates a configuration example of the transistors MP1 of the plurality of buffer circuits 21D. In this example, an N-well 221N is formed in a P-type semiconductor substrate 220P. The transistors MP1 of the plurality of buffer circuits 21D are formed in the N-well 221N. This causes the back gates of these transistors MP1 to be electrically coupled to each other via the N-well 221N.

The voltage generator 16D is configured to generate the direct-current voltage VDC. The voltage VDC is set to a voltage that causes PN junction configured by the source of the transistor MP1 and the N-well 221N to be reverse biased.

Thus, in the imaging device 1D, the voltage VDC is supplied to the back gates of the plurality of transistors MN1. Appropriately setting the voltage VDC makes it possible to decrease the absolute value of the gate-source voltage Vgs of the transistor MP1, which makes it possible to further decrease the power supply voltage VDD1 and reduce power consumption, for example. In addition, in the imaging device 1D, the plurality of transistors MP1 is provided in one N-well 221N, which makes it possible to reduce, for example, the area of a well contact, as compared with a case where each of the plurality of transistors MP1 is provided in a corresponding one of a plurality of N-wells. Accordingly, it is possible to reduce a layout area.

FIG. 14 illustrates a configuration example of a readout section 20E in another imaging device 1E according to the present modification example. The readout section 20E includes a buffer circuit 17E and a plurality of buffer circuits 21D. The buffer circuit 17E is configured to generate a reference signal RAMP2 on the basis of the reference signal RAMP. The back gates of the transistors MP1 of the plurality of buffer circuits 21D are coupled to each other. The back gates of these transistors MP1 are supplied with the reference signal RAMP2. The voltage level of the reference signal RAMP2 is set to a voltage level that causes PN junction configured by the source of the transistor MP1 and the N-well 221N to be reverse biased. Here, the buffer circuit 17E corresponds to a specific example of a "signal generator" in the present disclosure. The reference signal RAMP2 corresponds to a specific example of an "auxiliary reference signal" in the present disclosure.

Thus, in the imaging device 1E, the back gate of the transistor MP1 is supplied with the reference signal RAMP2 corresponding to the reference signal RAMP. Appropriately setting the voltage level of the reference signal RAMP2 makes it possible to decrease the absolute value of the gate-source voltage Vgs of the transistor MP1 as with the imaging device 1D, which makes it possible to further decrease the power supply voltage VDD1 and reduce power consumption, for example.

Modification Example 4

In the embodiment described above, in each of the plurality of AD converters ADC, the output terminal of the buffer circuit 21 is coupled to the comparison circuit 22, but this is not limitative. Instead of this, for example, the output terminals of the buffer circuits 21 of two or more AD converters ADC may be coupled to each other, and these output terminals may be coupled to the comparison circuits 22 of the two or more AD converters ADC. The present modification example is described in detail below.

FIGS. 15 and 16 illustrate a configuration example of a readout section 20F in an imaging device 1F according to the present modification example. The readout section 20F includes a plurality of AD converters ADC. In this example, the output terminals of the buffer circuits 21 in two AD converters ADC are coupled to each other. Specifically, the output terminal of the buffer circuit 21 of the 0th AD converter ADC[0] and the output terminal of the buffer circuit 21 of the first AD converter ADC[1] are coupled to each other. Thus, these two buffer circuits 21 generate the reference signal RAMP1. The comparison circuit 22 of the 0th AD converter ADC[0] and the comparison circuit 22 of the first AD converter ADC[1] perform an operation on the basis of the reference signal RAMP1. In addition, the output terminal of the buffer circuit 21 of the second AD converter ADC[2] and the output terminal of the buffer circuit 21 of the third AD converter ADC[3] are coupled to each other. Thus, these two buffer circuits 21 generate the reference signal RAMP1. The comparison circuit 22 of the second AD converter ADC[2] and the comparison circuit 22 of the third AD converter ADC[3] perform an operation on the basis of the reference signal RAMP1. The same applies to fourth and subsequent AD converters. Thus, two buffer circuits 21 generate the reference signal RAMP1, which makes it possible to decrease an output impedance of a circuit that generates the reference signal RAMP1, and makes it possible to reduce circuit noise included in the reference signal RAMP1 to $1/\sqrt{2}$, as compared with the embodiment described above.

It is to be noted that in this example, the output terminals of the buffer circuits 21 in two AD converters ADC are coupled to each other, but this is not limitative. Instead of this, the output terminals of the buffer circuits 21 in three or more AD converters ADC may be coupled to each other. For example, in a case where the output terminals of the buffer circuits 21 in N AD converters ADC are coupled to each other, it is possible to reduce circuit noise included in the reference signal RAMP1 to $1/\sqrt{N}$.

Modification Example 5

In addition, a variable resistor may be provided between the output terminals of the buffer circuits 21 in two AD converters ADC adjacent to each other of a plurality of AD converters ADC. The present modification example is described in detail below.

FIG. 17 illustrates a configuration example of a readout section 20G in an imaging device 1G according to the present modification example. The readout section 20G includes a plurality of transistors 19G, and a voltage generator 18G. The transistor 19G is an N-type MOS transistor, and is provided between the output terminals of the buffer circuits 21 of every two AD converters ADC adjacent to each other of the plurality of AD converters ADC. The transistor 19G has a source coupled to the output terminal of a certain buffer circuit 21, a drain coupled to the output terminal of the buffer circuit 21 adjacent to the certain buffer circuit 21, and a gate supplied with a control voltage Vctrl. A drain-source resistance value in the transistor 19G is changed depending on the control voltage Vctrl. That is, the transistor 19G functions as a variable resistor. The voltage generator 18G is configured to generate the control voltage Vctrl.

With this configuration, for example, in a case where the resistance value of the transistor 19G is increased, a resistance value between the output terminals of a plurality of buffer circuits 21 is increased, which makes it possible to reduce, for example, a possibility that streaking occurs in a captured image, as with the case of the readout section 20 (FIG. 5) according to the embodiment described above. As a result, it is possible to enhance image quality of the captured image. In addition, in a case where the resistance value of the transistor 19G is decreased, the resistance value between the output terminals of the plurality of buffer circuits 21 is decreased, which makes it possible to decrease an output impedance, and makes it possible to reduce circuit noise included in the reference signal RAMP1, as with the case of the readout section 20F (FIG. 16) according to the modification example 4.

It is to be noted that in this example, the variable resistor is configured by using an N-type MOS transistor, but this is not limitative. Instead of this, the variable resistor may be configured by using a P-type MOS transistor, for example.

In addition, in this example, all the plurality of AD converters ADC is coupled to each other via the transistor 19G, but this is not limitative. Instead of this, for example, the plurality of AD converters ADC may be divided into a plurality of groups each including two or more AD converters ADC, and the AD converters ADC belonging to the same group may be coupled to each other via the transistor 19G. In addition, a plurality of even-numbered AD converters ADC may be coupled to each other via the transistor 19G, and a plurality of odd-numbered AD converters ADC may be coupled to each other via the transistor 19G. Specifically, for example, the 0th AD converter ADC[0] and the second AD converter ADC[2] may be coupled to each other via the transistor 19G (a transistor 19G1), and the second AD converter ADC[2] and the fourth AD converter ADC[4] may be coupled to each other via the transistor 19G (a transistor 19G2). Likewise, the first AD converter ADC[1] and the third AD converter ADC[3] may be coupled to each other via the transistor 19G (a transistor 19G3), and the third AD converter ADC[3] and the fifth AD converter ADC[5] may be coupled to each other via the transistor 19G (a transistor 19G4).

In addition, in this example, one voltage generator 18G is provided, and the voltage generator 18G controls resistance values of all the transistors 19G, hut this is not limitative. Instead of this, for example, a plurality of voltage generators may be provided, and the plurality of voltage generators may control resistance values of the transistors 19G different from each other.

Modification Example 6

In addition, as with a readout section 20H illustrated in FIG. 18, the output terminals of the buffer circuits 21 of two AD converters ADC that are not adjacent to each other may be coupled to each other. In this example, an nth AD converter ADC[n], an (n+2)th AD converter ADC[n+2], an (n+3)th AD converter ADC[n+3], and an (n+5)th AD converter ADC[n+5] are included in a group (a first group), and the output terminals of the buffer circuits 21 of a plurality of AD converters ADC belonging to this first group are coupled to each other. In addition, an (n+4)th AD converter ADC [n+4], an (n+6)th AD converter ADC[n+6], an (n+7)th AD converter ADC[n+7], and an (n+9)th AD converter ADC[n+ 9] are included in another group (a second group), and the output terminals of the buffer circuits 21 of a plurality of AD converters ADC belonging to this second group are coupled to each other. That is, the buffer circuit 21 of the AD converter ADC[n+4] provided between the AD converter ADC[n+3] and the AD converter ADC[n+5] of which the butler circuits 21 are coupled to each other is not coupled to these buffer circuits 21. Interference occurs among the plurality of AD converters ADC belonging to the first group, and similarly, interference occurs among the plurality of AD converters ADC belonging to the second group. The degree of interference among the plurality of AD converters ADC belonging to the first group is different from the degree of interference among the plurality of AD converters ADC belonging to the second group. Accordingly, disposing the AD converters ADC belonging to the second group between the plurality of AD converters ADC belonging to the first group makes it possible to blur a boundary of an image based on a difference in the degree of interference.

Modification Example 7

In the embodiment described above, as illustrated in FIG. 4A, the comparison circuit 22 includes a single end type circuit, but this is not limitative. Instead of this, for example, the comparison circuit may include a differential type circuit. Comparison circuits 32A and 32B according to the present modification example are described in detail below.

FIG. 19A illustrates a configuration example of the comparison circuit 32A. The initial-stage circuit 101 of the comparison circuit 32A includes transistors MP21 to MP23, switches SW21 and SW22, and transistors MN21 and MN22. The transistors MP21 to MP23 are P-type MOS transistors, and the transistors MN21 and MN22 are N-type MOS transistors.

Capacitors C21 and C22 each have one end and another end. The capacitor C21 has the one end supplied with the reference signal RAMP1, and the other end coupled to the other end of the capacitor C22, a gate of the transistor MP21, and one end of the switch SW21. The capacitor C22 has the one end supplied with the signal SIG, and the other end coupled to the other end of the capacitor C21, the gate of the transistor MP21, and the one end of the switch SW21. A capacitor C23 has one end supplied with the direct-current voltage VREF, and another end coupled to a gate of the transistor MP22 and one end of the switch SW22.

The transistor MP21 has the gate coupled to the other ends of the capacitors C21 and C22 and the one end of the switch SW21, a drain coupled o a drain of the transistor MN21, gates of the transistors MN21 and MN22, and another end of the switch SW21, and a source coupled to a source of the transistor MP22 and a drain of the transistor MP23. The transistor MP22 has the gate coupled to the other end of the capacitor C23, the one end of the switch SW22, a drain coupled to a drain of the transistor MN22, another end of the switch SW22, and the input terminal of the post-stage circuit 102, and the source coupled to the source of the transistor MP21 and the drain of the transistor MP23. The transistor MP23 has a gate supplied with the bias voltage VB4, the drain coupled to the sources of the transistors MP21 and MP22, and a source supplied with the power supply voltage VDD2. The transistor MP23 operates as a current source, and the transistors MP21 and MP22 operate as a differential pair.

The switch SW21 is configured to be turned on and off on the basis of the control signal AZSW. The switch SW21 has the one end coupled to the other ends of the capacitors C21 and C22 and the gate of the transistor MP21, and the other end coupled to the drains of the transistors MP21 and MN21 and the gates of the transistors MN21 and MN22. The switch SW22 is configured to be turned on and off on the basis of the control signal AZSW. The switch SW22 has the one end coupled to the other end of the capacitor C23 and the gate of the transistor MP22, and the other end coupled to the drains of the transistors MP22 and MN22 and the input terminal of the post-stage circuit 102.

The transistor MN21 has the gate coupled to the gate of the transistor MN22, the drains of the transistors MN21 and MP21, and the other end of the switch SW21, the drain coupled to the gates of the transistors MN21 and MN22, the drain of the transistor MP21, and the other end of the switch SW21, and a source supplied with the ground voltage VSS2. The transistor MN22 has the gate coupled to the gate of the transistor MN21, the drains of the transistors MN21 and MP21, the other end of the switch SW21, the drain coupled to the post-stage circuit 102, the drain of the transistor MP22, and the other end of the switch SW22, and a source supplied with the ground voltage VSS2. The transistors MN21 and MN22 operate as loads of the transistors MP21 and MP22 that are a differential pair.

Here, the comparison circuit 32A corresponds to a specific example of a "first comparison circuit" in the present disclosure. The transistor MP21 corresponds to a specific example of a "first transistor" in the present disclosure. The transistor MP22 corresponds to a specific example of a "fifth transistor" in the present disclosure. The transistor MP23 corresponds to a specific example of a "current source" in the present disclosure. The capacitor C21 corresponds to a specific example of a "first capacitor" in the present disclosure. The capacitor C22 corresponds to a specific example of a "second capacitor" in the present disclosure. The capacitor C23 corresponds to a specific example of a "third capacitor" in the present disclosure. The switch SW21 corresponds to a specific example of a "first switch" in the present disclosure. The switch SW22 corresponds to a specific example of a "third switch" in the present disclosure. The transistor MN21 corresponds to a specific example of a "first load transistor" in the present disclosure. The transistor MN22 corresponds to a specific example of a "second load transistor" in the present disclosure.

FIG. 19B illustrates a configuration example of the comparison circuit 32B. The initial-stage circuit 101 of the comparison circuit 32B includes transistors MN24 to MN26, switches SW24 and SW25, and transistors MP24 and MP25. The transistors MN24 to MN26 are N-type MOS transistors, and the transistors MP24 and MP25 are P-type MOS transistors. Capacitors C24 to C26 of the comparison circuit 32B respectively correspond to the capacitors C21 to C23 of the comparison circuit 32A. The transistors MN24 to MN26 of the comparison circuit 32B respectively correspond to the transistors MP21 to MP23 of the comparison circuit 32A. The switches SW24 and SW25 of the comparison circuit 32B respectively correspond to the switches SW21 and SW22 of the comparison circuit 32A. The transistors MP24 and MP25 of the comparison circuit 32B respectively correspond to the transistors MN21 and MN22 of the comparison circuit 32A.

Modification Example 8

In the embodiment described above, for example, as illustrated in FIG. 4A, the comparison circuit 22 combines the voltage of the signal SIG and the voltage of the reference signal RAMP1 with use of the capacitors C1 and C2, and performs a comparison operation on the basis of a thus-combined voltage, but this is not limitative. Comparison circuits 42A and 42B according to the present modification example are described in detail below.

FIG. 20A illustrates a configuration example of the comparison circuit 42A. The comparison circuit 42A includes capacitors C31 and C32. The capacitor C31 has one end supplied with the reference signal RAMP1 and another end coupled to the gate of the transistor MP21 and the one end of the switch SW21. The capacitor C32 has one end supplied with the signal SIG and another end coupled to the gate of the transistor MP22 and the one end of the switch SW22. Here, the capacitor C31 corresponds to a specific example of a "first capacitor" in the present disclosure. The capacitor C32 corresponds to a specific example of a "second capacitor" in the present disclosure.

FIG. 20B illustrates a configuration example of the comparison circuit 42B. The comparison circuit 42B includes capacitors C34 and C35. The capacitor C34 has one end supplied with the reference signal RAMP1, and another end coupled to a gate of the transistor MN24 and one end of the switch SW24. The capacitor C35 has one end supplied with the signal SIG, and another end coupled to a gate of the transistor MN25 and one end of the switch SW25.

Other Modification Examples

In addition, two or more of these modification examples may be combined.

<2. Usage Examples of Imaging Device>

FIG. 21 illustrates usage examples of the imaging device 1 according to the embodiment described above. For example, the imaging device 1 described above is usable in a variety of cases of sensing light such as visible light, infrared light, ultraviolet light, and X-rays as follows.

- Devices that shoot images for viewing such as digital cameras and mobile devices having a camera function
- Devices for traffic use such as onboard sensors that shoot images of the front, back, surroundings, inside, and so on of an automobile for safe driving such as automatic stop and for recognition of a driver's state, monitoring cameras that monitor traveling vehicles and roads, and distance measuring sensors that measure a distance between vehicles and the like
- Devices for use in home electrical appliances such as televisions, refrigerators, and air-conditioners to shoot images of user's gesture and operate the appliances in accordance with the gesture
- Devices for medical care and healthcare use such as endoscopes and devices that shoot images of blood vessels by receiving infrared light
- Devices for security use such as monitoring cameras for crime prevention and cameras for individual authentication
- Devices for beauty care use such as skin measuring devices that shoot images of skin and microscopes that shoot images of scalp
- Devices for sports use such as action cameras and wearable cameras for sports applications. etc.
- Devices for agricultural use such as cameras for monitoring fields and crops <3. Application Example to Mobile Body>

The technology (the present technology) according to the present disclosure is applicable to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, and a robot.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22 an audio speaker 12061, a display section 12062, and an instrument panel 12063 are illustrated as the output device. The display section 12062 may, for example, include at least one of an on-board display and a head-up display.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object, When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 among the components described above. This makes it possible to enhance image quality of a captured image in the vehicle control system 12000. This allows the vehicle control system 12000 to enhance the accuracy of collision avoidance or shock mitigation for vehicles, a following driving function based on a following distance, a vehicle speed maintaining driving function, a warning function of collision of the vehicle, a warning function of deviation of the vehicle from a lane, and the like.

<4. Application Example to Distance Measuring Device>

Next, one example in a case where the present technology is applied to a distance measuring device is described in detail.

FIG. 35 illustrates a configuration example of a distance measuring device 900 according to the present application example. The distance measuring device 900 is configured to measure a distance to a measurement object OBJ by an indirect method. The distance measuring device 900 includes a light-emitting section 901, an optical system 902, a photodetector 910, and a controller 903.

The light-emitting section 901 is configured to emit an optical pulse L0 toward the measurement object OBJ. The light-emitting section 901 emits the optical pulse L0 on the basis of an instruction from the controller 903 by performing a light-emitting operation in which light emission and non-light emission are alternately repeated. The light-emitting section 901 includes, for example, a light source that emits infrared light. The light source is configured by using, for example, a laser light source, an LED (Light Emitting Diode), or the like.

The optical system 902 includes a lens that forms an image on a light reception surface S of the photodetector 910. An optical pulse (a reflected optical pulse L1) emitted from the light-emitting section 901 and reflected by the measurement object OBJ enters the optical system 902.

The photodetector 910 is configured to generate a distance image PIC on the basis of an instruction from the controller 903 by detecting light. Each of a plurality of pixel values included in the distance image PIC indicates a value about a distance D to the measurement object OBJ. Then, the photodetector 910 outputs the generated distance image PIC as the image signal DATA.

The controller 903 is configured to supply a control signal to the light-emitting section 901 and the photodetector 910 and control operations of the light-emitting section 901 and the photodetector 910, thereby controlling an operation of the distance measuring device 900.

FIG. 36 illustrates a configuration example of the photodetector 910. The photodetector 910 includes a pixel array 911, a driving section 912, a reference signal generator 913, a readout section 919, a signal processor 914, and an imaging controller 915. For example, the pixel array 911, the driving section 912, the reference signal generator 913, the readout section 919, the signal processor 914, and the imaging controller 915 may be formed in one semiconductor substrate. In addition, the pixel array 911 may be formed in one semiconductor substrate, and the driving section 912, the reference signal generator 913, the readout section 919, the signal processor 914, and the imaging controller 915 may be formed in another semiconductor substrate. These two semiconductor substrates may be superimposed on each other.

The pixel array 911 includes a plurality of pixels 920 arranged in a matrix. The pixels 920 each are configured to generate the pixel voltage Vpix corresponding to an amount of received light.

FIG. 37 illustrates a configuration example of the pixel 920. The pixel array 911 includes a plurality of control lines 931A, a plurality of control lines 931B, a plurality of control lines 932A, a plurality of control lines 932A, a plurality of control lines 933, a plurality of signal lines 939A, and a plurality of signal lines 939B.

The pixels 920 each include a photodiode 921, floating diffusions 923A and 923B, and transistors 922A, 922B, 924A, 924B, 925A, 925B, 926A, and 926B. A circuit including the photodiode 921, the floating diffusion 923A, and the transistors 922A, 924A, 925A, and 926A is also referred to as a tap A. In addition, a circuit including the photodiode 921, the floating diffusion 923B, and the transistors 922B, 924B, 925B, and 926B is also referred to as a tap B.

In the tap A, the transistor 922A has a gate coupled to the control line 931A, a source coupled to the photodiode 921, and a drain coupled to the floating diffusion 923A. The floating diffusion 923A is configured to accumulate electric charges supplied from the photodiode 921 via the transistor 922A. The transistor 924A has a gate coupled to the control line 932A, a drain supplied with the power supply voltage VDD, and a source coupled to the floating diffusion 923A. The transistor 925A has a gate coupled to the floating diffusion 923A, a drain supplied with the power supply voltage VDD, and a source coupled to a drain of the transistor 926A. The transistor 926A has a gate coupled to the control line 933, the drain coupled to the source of the transistor 925A, and a source coupled to the signal line 939.A. The tap A has been described above as an example, and the same applies to the tap B.

With this configuration, in each of the pixels 920, the transistor 924A is turned on to reset the floating diffusion 923A, and the transistor 924B is turned on to reset the floating diffusion 923B. Then, one of the transistors 922A and 922B is alternately turned on to selectively accumulate electric charges generated by the photodiode 921 in the floating diffusion 923A and the floating diffusion 923B. Then, the transistors 926A and 926B are turned on to cause the pixel 920 to output, to the signal line 939A, a pixel signal corresponding to an amount of electric charges accumulated in the floating diffusion 923A and output, to the signal line 939B, a pixel signal corresponding to an amount of electric charges accumulated in the floating diffusion 923B.

The driving section 912 (FIG. 36) is configured to sequentially drive the plurality of pixels 920 in the pixel array 911 in units of the pixel lines L on the basis of an instruction from the imaging controller 915. The reference signal generator 913 is configured to generate the reference signal RAMP on the basis of an instruction from the imaging controller 915. The readout section 919 is configured to generate the image signal DAT0 on the basis of an instruction from the imaging controller 915 by performing AD conversion on the basis of the pixel signals supplied from the pixel array 911 via the signal lines 939A and 939B. The signal processor 914 is configured to generate the distance image PIC on the basis of an instruction from the imaging controller 915 by performing predetermined signal processing on the image signal DATA0, and output the image signal DATA including the distance image PIC. The imaging controller 915 is configured to supply a control signal to the driving section 912, the reference signal generator 913, the readout section 919, and the signal processor 914, and control operations of these circuits, thereby controlling an operation of the photodetector 910.

FIG. 38 illustrates an operation example of the distance measuring device 900. (A) of FIG. 38 indicates a waveform of the optical pulse L0 to be emitted from the light-emitting section 901, and (B) of FIG. 38 indicates a waveform of the reflected optical pulse L1 to be detected by the photodetector 910.

The light-emitting section 901 emits the optical pulse L0 having a pulse waveform with a duty ratio of 50% on the basis of an instruction from the controller 903 ((A) of FIG. 38). The optical pulse L0 travels toward the measurement object OBJ. Then, the optical pulse L0 is reflected by the measurement object OBJ, and the reflected optical pulse L1 thus-reflected travels toward the photodetector 910. Then, the pixel 920 of this photodetector 910 detects the reflected optical pulse L1 ((B) of FIG. 38). The reflected optical pulse L1 detected by the pixel 920 has a waveform delayed by a delay time DL with respect to the waveform of the optical pulse L0 illustrated in (A) of FIG. 38. The delay time DL is a time in which light travels in order of the light-emitting section 901, the measurement object OBJ, and the photodetector 910, and corresponds to flight time of light. The flight time of light corresponds a distance between the distance measuring. device 900 and the measurement object OBJ.

In the indirect method, the floating diffusion 923A of the pixel 920 accumulates signal electric charges Q1 corresponding to an amount of light received by the photodiode 921 in a period 941 in which the light-emitting section 901 emits light, and the floating diffusion 923B of the pixel 920 accumulates signal electric charges Q2 corresponding to the amount of light received by the photodiode 921 in a period 942 in which the light-emitting section 901 does not emit light. Then, the signal processor 914 determines an electric charge ratio between the signal electric charges Q1 and the signal electric charges Q2. The photodiode 921 detects light in the periods 951 and 952; therefore, the electric charge amount of the signal electric charges Q1 is proportional to the length of the period 951, and the electric charge amount of the signal electric charges Q2 is proportional to the length of the period 952. In a case where the delay time DL is short, the signal electric charges Q1 are increased and the signal electric charges Q2 are decreased. In a case where the delay time DL is long, the signal electric charges Q1 are decreased, and the signal electric charges Q2 are increased. Thus, the electric charge ratio between the signal electric charges Q1 and the signal electric charges Q2 is changed depending on the delay time DL. In the indirect method, determining the electric charge ratio makes it possible to determine the delay time DL with high accuracy, for example. As a result, it is possible to measure a distance to the measurement object OBJ with high accuracy. The present technology is applicable to the readout section 919. This makes it possible to enhance image quality of a distance image.

Although the present technology has been described above referring to some embodiments, the modification examples, and specific application examples thereof, the present technology is not limited to these embodiments and the like, and may be modified in a variety of ways.

For example, in the embodiment described above, the pixel P is configured as illustrated in FIG. 2, but this is not limitative. It is possible to use pixels having various configurations.

It is to be noted that the effects described herein are merely illustrative and non-limiting, and other effects may be provided.

It is to be noted that the present technology may have the following configurations. According to the present technology having the following configurations, it is possible to enhance image quality.

(1)

A photodetection device including:
a first pixel that is configured to generate a first pixel signal;
a reference signal generator that is configured to generate a reference signal; and
a first converter that includes a first buffer circuit and a first comparison circuit and is configured to convert the first pixel signal into a digital code, the first buffer circuit configured to output a first signal corresponding to the reference signal from an output terminal, and the first comparison circuit configured to perform a comparison operation on the basis of the first pixel signal and the first signal.

(2)

The photodetection device according to (1), in which
the first pixel is configured to output the first pixel signal from an output terminal, and
the first comparison circuit includes
a first transistor having a gate and a drain,
a first capacitor having a first terminal coupled to the output terminal of the first buffer circuit, and a second terminal coupled to the gate of the first transistor,
a second capacitor having a first terminal coupled to the output terminal of the first pixel, and a second terminal coupled to the gate of the first transistor,
a first switch that is configured to couple the gate of the first transistor and the drain of the first transistor to each other by being turned on, and
a load circuit coupled to the drain of the first transistor.

(3)

The photodetection device according to (2), in which
the first transistor has a source coupled to a first power supply node, and
the load circuit includes a first load transistor having a gate supplied with a predetermined voltage, a drain coupled to the drain of the first transistor, and a source coupled to a second power supply node.

(4)

The photodetection device according to (3), in which a power supply voltage to be supplied to the first buffer circuit is higher than a power supply voltage at the first power supply node.

(5)

The photodetection device according to (3), in which a power supply voltage to be supplied to the first buffer circuit is same as a power supply voltage at the first power supply node.

(6)

The photodetection device according to any one of (3) to (5), in which
the first comparison circuit further includes
a second transistor having a gate coupled to the drain of the first transistor, a drain, and a source coupled to the first power supply node,
a third transistor having a gate, a drain coupled to the drain of the second transistor, and a source coupled to the second power supply node, and
a second switch that is configured to couple the gate of the third transistor and the drain of the third transistor to each other by being turned on.

(7)

The photodetection device according to (6), in which the first comparison circuit further includes a fourth transistor having a gate coupled to the drain of the second. transistor, a drain coupled to the first power supply node, and a source coupled to the drain of the first transistor.

(8)

The photodetection device according to (2), in which
the first transistor has a source,
the first comparison circuit further includes
a fifth transistor having a gate, a drain, and a source,
a third capacitor coupled to the gate of the fifth transistor,
a current source coupled to the source of the first transistor and the source of the fifth transistor, and
a third switch that is configured to couple the gate of the fifth transistor and the drain of the fifth transistor to each other by being turned on, and
the load circuit is also coupled to the drain of the fifth transistor in addition to the drain of the first transistor.

(9)

The photodetection device according to (1), in which
the first pixel is configured to output the first pixel signal from an output terminal, and
the first comparison circuit includes
a first transistor having a gate, a drain, and a source,
a fifth transistor having a gate, a drain, and a source,
a current source coupled to the source of the first transistor and the source of the fifth transistor,
a first capacitor having a first terminal coupled to the output terminal of the first buffer circuit, and a second terminal coupled to the gate of the first transistor,
a second capacitor having a first terminal coupled to the output terminal of the first pixel, and a second terminal coupled to the gate of the fifth transistor,
a first switch that is configured to couple the gate of the first transistor and the drain of the first transistor to each other by being turned on,
a third switch that is configured to couple the gate of the fifth transistor and the drain of the fifth transistor to each other by being turned on, and
a load circuit coupled to the drain of the first transistor and the drain of the fifth transistor.

(10)

The photodetection device according to (8) or (9), in which
the load circuit includes
a first load transistor having a gate, and a drain coupled to the drain of the first transistor, and
a second load transistor having a gate coupled to the gate of the first load transistor, and a drain coupled to the drain of the fifth transistor.

(11)

The photodetection device according to any one of (1) to (10), in which
the reference signal generator is configured to output the reference signal from an output terminal, and
the first buffer circuit includes
a first buffer transistor having a gate coupled to the output terminal of the reference signal generator, and a source coupled to the output terminal of the first buffer circuit, and a first current source coupled to the source of the first buffer transistor.

(12)

The photodetection device according to (11), in which the first buffer transistor further has a back gate coupled to the source of the first buffer transistor.

(13)

The photodetection device according to (11), further including a voltage generator that is configured to output a predetermined voltage from an output terminal, in which
the first buffer transistor further has a back gate coupled to the output terminal of the voltage generator.

(14)

The photodetection device according to (11), further including a signal generator that is configured to generate an auxiliary reference signal on the basis of the reference signal and is configured to output the auxiliary reference signal from an output terminal, in which
the first buffer transistor further has a back gate coupled to the output terminal of the signal generator.

(15)

The photodetection device according to any one of (1) to (14), further including:
a second pixel that is configured to generate a second pixel signal; and
a second converter that includes a second buffer circuit and a second comparison circuit and is configured to convert the second pixel signal into a digital code, the second buffer circuit configured to output a second signal corresponding to the reference signal from an output terminal, and the second comparison circuit configured to perform the comparison operation on the basis of the second pixel signal and the second signal.

(16)

The photodetection device according to (15), in which the output terminal of the second buffer circuit is coupled to the output terminal of the first buffer circuit.

(17)

The photodetection device according to (16), further including:
a third pixel that is configured to generate a third pixel signal; and
a third converter that includes a third buffer circuit and a third comparison circuit and is configured to convert the third pixel signal into a digital code, the third buffer circuit configured to output a third signal corresponding to the reference signal from an output terminal, and the third comparison circuit configured to perform the comparison operation on the basis of the third pixel signal and the third signal, in which
the output terminal of the third buffer circuit is electrically insulated from the output terminal of the first buffer circuit, and is electrically insulated from the output terminal of the second buffer circuit, and
the third converter is provided between the first converter and the second converter.

(18)

The photodetection device according to (15), further including a variable resistor having a first terminal coupled to the output terminal of the first buffer circuit, and a second terminal coupled to the output terminal of the second buffer circuit.

(19)

An electronic apparatus including:
a photodetection device; and
a processor that controls an operation of the photodetection device,
the photodetection device including
a first pixel that is configured to generate a first pixel signal,
a reference signal generator that is configured to generate a reference signal, and
a first converter that includes a first buffer circuit and a first comparison circuit and is configured to convert the first pixel signal into a digital code, the first buffer circuit configured to output a first signal corresponding to the reference signal from an output terminal, and the first comparison circuit configured to perform a comparison operation on the basis of the first pixel signal and the first signal.

This application claims the benefit of Japanese Priority Patent Application JP2019-065376 filed with Japan Patent Office on Mar. 29, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photodetection device comprising:
a first pixel that is configured to generate a first pixel signal;
a reference signal generator that is configured to generate a reference signal; and
a first converter that includes a first buffer circuit and a first comparison circuit and that is configured to convert the first pixel signal into a digital code, the first buffer circuit configured to output a first signal corresponding to the reference signal from an output terminal, and the first comparison circuit configured to perform a comparison operation on a basis of the first pixel signal and the first signal, wherein
the first pixel is configured to output the first pixel signal from an output terminal, and
the first comparison circuit includes
a first transistor having a gate and a drain,
a first capacitor having a first terminal coupled to the output terminal of the first buffer circuit, and a second terminal coupled to the gate of the first transistor,
a second capacitor having a first terminal coupled to the output terminal of the first pixel, and a second terminal coupled to the gate of the first transistor,
a first switch that is configured to couple the gate of the first transistor and the drain of the first transistor to each other by being turned on, and
a load circuit coupled to the drain of the first transistor.

2. The photodetection device according to claim 1, wherein
the first transistor has a source coupled to a first power supply node, and
the load circuit includes a first load transistor having a gate supplied with a predetermined voltage, a drain coupled to the drain of the first transistor, and a source coupled to a second power supply node.

3. The photodetection device according to claim 2, wherein
a power supply voltage to be supplied to the first buffer circuit is higher than a power supply voltage at the first power supply node.

4. The photodetection device according to claim 2, wherein a power supply voltage to be supplied to the first buffer circuit is same as a power supply voltage at the first power supply node.

5. The photodetection device according to claim 2, wherein
the first comparison circuit further includes
a second transistor having a gate coupled to the drain of the first transistor, a drain, and a source coupled to the first power supply node,
a third transistor having a gate, a drain coupled to the drain of the second transistor, and a source coupled to the second power supply node, and
a second switch that is configured to couple the gate of the third transistor and the drain of the third transistor to each other by being turned on.

6. The photodetection. device according to claim 5, wherein
the first comparison circuit further includes a fourth transistor having a gate coupled to the drain of the second transistor, a drain coupled to the first power supply node, and a source coupled to the drain of the first transistor.

7. The photodetection device according to claim 1, wherein
the first transistor has a source;
the first comparison circuit further includes
a fifth transistor having a gate, a drain, and a source,
a third capacitor coupled to the gate of the fifth transistor,
a current source coupled to the source of the first transistor and the source of the fifth transistor, and
a third switch that is configured to couple the gate of the fifth transistor and the drain of the fifth transistor to each other by being turned on; and
the load circuit is coupled to the drain of the fifth transistor and to the drain of the first transistor.

8. The photodetection device according to claim 7, wherein the load circuit includes
a first load transistor having a gate, and a drain coupled to the drain of the first transistor, and
a second load transistor having a gate coupled to the gate of the first load transistor, and a drain coupled to the drain of the fifth transistor.

9. An electronic apparatus comprising:
a photodetection device according to claim 1; and
a processor that controls an operation of the photodetection device.

10. A photodetection device comprising:
a first pixel that is configured to generate a first pixel signal;
a reference signal generator that is configured to generate a reference signal; and
a first converter that includes a first buffer circuit and a first comparison circuit and that is configured to convert the first pixel signal into a digital code, the first buffer circuit configured to output a first signal corresponding to the reference signal from an output terminal, and the first comparison circuit configured to perform a comparison operation on a basis of the first pixel signal and the first signal, wherein
the first pixel is configured to output the first pixel signal from an output terminal, and
the first comparison circuit includes
a first transistor having a gate, a drain, and a source,
a fifth transistor having a gate, a drain, and a source,
a current source coupled to the source of the first transistor and the source of the fifth transistor,
a first capacitor having a first terminal coupled to the output terminal of the first buffer circuit, and a second terminal coupled to the gate of the first transistor,
a second capacitor having a first terminal coupled to the output terminal of the first pixel, and a second terminal coupled to the gate of the fifth transistor,
a first switch that is configured to couple the gate of the first transistor and the drain of the first transistor to each other by being turned on,
a third switch that is configured to couple the gate of the fifth transistor and the drain of the fifth transistor to each other by being turned on, and
a load circuit coupled to the drain of the first transistor and the drain of the fifth transistor.

11. An electronic apparatus comprising:
a photodetection device according to claim 10; and
a processor that controls an operation of the photodetection device.

12. A photodetection device comprising:
a first pixel that is configured to generate a first pixel signal;
a reference signal generator that is configured to generate a reference signal; and
a first converter that includes a first buffer circuit and a first comparison circuit and that is configured to convert the first pixel signal into a digital code, the first buffer circuit configured to output a first signal corresponding to the reference signal from an output terminal, and the first comparison circuit configured to perform a comparison operation on a basis of the first pixel signal and the first signal, wherein
the reference signal generator is configured to output the reference signal from an output terminal, and
the first buffer circuit includes a first buffer transistor having a gate coupled to the output terminal of the reference signal generator, and a source coupled to the output terminal of the first buffer circuit, and a first current source coupled to the source of the first buffer transistor.

13. The photodetection device according to claim 12, wherein
the first buffer transistor further includes a back gate coupled to the source of the first buffer transistor.

14. The photodetection device according to claim 12, further comprising:
a voltage generator that is configured to output a predetermined voltage from an output terminal, wherein
the first buffer transistor further includes a back gate coupled to the output terminal of the voltage generator.

15. The photodetection device according to claim 12, further comprising a signal generator that is configured to generate an auxiliary reference signal on a basis of the reference signal and is configured to output the auxiliary reference signal from an output terminal, wherein
the first buffer transistor further has a back gate coupled to the output terminal of the signal generator.

16. An electronic apparatus comprising:
a photodetection device according to claim 12; and
a processor that controls an operation of the photodetection device.

17. A photodetection device according comprising:
a first pixel that is configured to generate a first pixel signal;
a reference signal generator that is configured to generate a reference signal;

a first converter that includes a first buffer circuit and a first comparison circuit and that is configured to convert the first pixel signal into a digital code, the first buffer circuit configured to output a first signal corresponding to the reference signal from an output terminal, and the first comparison circuit configured to perform a comparison operation on a basis of the first pixel signal and the first signal;

a second pixel that is configured to generate a second pixel signal; and a second converter that includes a second buffer circuit and a second comparison circuit and is configured to convert the second pixel signal into a digital code, the second buffer circuit configured to output a second signal corresponding to the reference signal from an output terminal, and the second comparison circuit configured to perform the comparison operation on a basis of the second pixel signal and the second signal, wherein the output terminal of the second buffer circuit is coupled to the output terminal of the first buffer circuit.

18. The photodetection device according to claim 17, further comprising:

a third pixel that is configured to generate a third pixel signal; and a third converter that includes a third buffer circuit and a third comparison circuit and is configured to convert the third pixel signal into a digital code, the third buffer circuit configured to output a third signal corresponding to the reference signal from an output terminal, and the third comparison circuit configured to perform the comparison operation on a basis of the third pixel signal and the third signal, wherein the output terminal of the third buffer circuit is electrically insulated from the output terminal of the first buffer circuit, and is electrically insulated from the output terminal of the second buffer circuit, and the third converter is provided between the first converter and the second converter.

19. An electronic apparatus comprising:

a photodetection device according to claim 17; and a processor that controls an operation of the photodetection device.

20. A photodetection device comprising:

a first pixel that is configured to generate a first pixel signal;

a reference signal generator that is configured to generate a reference signal;

a first converter that includes a first buffer circuit and a first comparison circuit and that is configured to convert the first pixel signal into a digital code, the first buffer circuit configured to output a first signal corresponding to the reference signal from an output terminal, and the first comparison circuit configured to perform a comparison operation on a basis of the first pixel signal and the first signal;

a second pixel that is configured to generate a second pixel signal; and a second converter that includes a second buffer circuit and a second comparison circuit and is configured to convert the second pixel signal into a digital code, the second buffer circuit configured to output a second signal corresponding to the reference signal from an output terminal, and the second comparison circuit configured to perform the comparison operation on a basis of the second pixel signal and the second signal; and a variable resistor having a first terminal coupled to the output terminal of the first buffer circuit, and a second terminal coupled to the output terminal of the second buffer circuit.

21. An electronic apparatus comprising:

a photodetection device according to claim 20; and a processor that controls an operation of the photodetection device.

* * * * *